United States Patent
Kokusho

(10) Patent No.: US 11,429,468 B2
(45) Date of Patent: Aug. 30, 2022

(54) WINDOW TYPE WATCHDOG TIMER AND SEMICONDUCTOR DEVICE

(71) Applicant: Rohm Co., Ltd., Kyoto (JP)

(72) Inventor: Yuichi Kokusho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 444 days.

(21) Appl. No.: 16/700,572

(22) Filed: Dec. 2, 2019

(65) Prior Publication Data

US 2020/0183770 A1  Jun. 11, 2020

(30) Foreign Application Priority Data

Dec. 6, 2018 (JP) .............................. JP2018-228804

(51) Int. Cl.
| | |
|---|---|
| G06F 11/07 | (2006.01) |
| H03K 3/01 | (2006.01) |
| H03K 21/38 | (2006.01) |
| H03K 21/02 | (2006.01) |

(52) U.S. Cl.
CPC ...... G06F 11/0757 (2013.01); G06F 11/0793 (2013.01); H03K 3/01 (2013.01); H03K 21/02 (2013.01); H03K 21/38 (2013.01)

(58) Field of Classification Search
CPC ............. G06F 11/0757; G06F 11/0754; G06F 11/076; G06F 11/0793
See application file for complete search history.

(56) References Cited

U.S. PATENT DOCUMENTS

| | | | | |
|---|---|---|---|---|
| 8,447,965 B2 * | 5/2013 | Minagawa | .......... | G06F 11/0757 713/1 |
| 11,043,045 B2 * | 6/2021 | Matsuura | ............. | H03K 19/007 |

FOREIGN PATENT DOCUMENTS

JP  2018-022256  2/2018

* cited by examiner

*Primary Examiner* — Hai L Nguyen
(74) *Attorney, Agent, or Firm* — Fish & Richardson P.C.

(57) ABSTRACT

A window type watchdog timer includes a frequency dividing circuit for generating a frequency-divided clock signal by dividing a frequency of a reference clock signal; a monitoring circuit for monitoring occurrence of a first error in which clear control from a target device is interrupted for a first time or more, and occurrence of a second error in which an interval between two consecutive clear controls from the target device is shorter than a second time shorter than the first time, based on the frequency-divided clock signal; and outputting an error signal when the first error or the second error is detected; and a setting circuit for variably setting the first time and the second time by variably setting a frequency division ratio in the frequency dividing circuit and variably setting a detection condition of the first error and the second error.

11 Claims, 14 Drawing Sheets

☆ : Clear control
(input of clear signal)

☆ : Clear control
(input of clear signal)

WINDOW TYPE WATCHDOG TIMER AND SEMICONDUCTOR DEVICE

CROSS-REFERENCE TO RELATED APPLICATION

This application is based upon and claims the benefit of priority from Japanese Patent Application No. 2018-228804, filed on Dec. 6, 2018, the entire contents of which are incorporated herein by reference.

TECHNICAL FIELD

The present disclosure relates to a window type watchdog timer and a semiconductor device.

BACKGROUND

FIG. 19 shows a configuration example of an arithmetic processing system including a window type watchdog timer 910 configured with a digital circuit, and a microcomputer 920 as a monitoring target device whose operation is monitored by the window type watchdog timer 910. An external component 930 is connected to an external terminal 913 provided in the watchdog timer 910. The external component 930 is a resistor or a capacitor. The watchdog timer 910 is provided with an oscillation circuit 911 and a counter 912. The oscillation circuit 911 generates a clock signal having a frequency corresponding to a resistance value of the resistor as the external component 930 or a capacitance value of the capacitor as the external component 930. The counter 912 obtains a count value CNT by counting the number of clocks of the clock signal (or a frequency-divided clock signal obtained by dividing the frequency of the clock signal) from the oscillation circuit 911.

In normal operation, the microcomputer 920 outputs a clear signal (for example, a pulse) to the watchdog timer 910 at a constant period longer than a predetermined fast determination time and shorter than a predetermined slow determination time. The count value CNT is reset each time a clear signal is input.

A slow determination threshold value corresponding to the slow determination time and a fast determination threshold value corresponding to the fast determination time are determined for the count value CNT. Then, when the count value CNT reaches the slow determination threshold value, the watchdog timer 910 determines that the input of the clear signal has been interrupted for the slow determination time or longer, and outputs a reset signal to the microcomputer 920. In addition, before the count value CNT reaches the fast determination threshold value after the count value CNT is reset in response to the input of the clear signal, when the clear signal is again input to reset the count value CNT, the watchdog timer 910 determines that the clear signal input interval is too short, and outputs a reset signal to the microcomputer 920. The state in which the reset signal is output is considered to correspond to a state in which the microcomputer 920 is frozen or runaway, and the microcomputer 920 is restarted in response to the input of the reset signal.

In the arithmetic processing system shown in FIG. 19, the slow determination time and the fast determination time can be changed by changing an integer of the external component 930. However, the slow determination time and the fast determination time may increase or decrease at a common magnification, and thus a flexibility of design (software design) of the microcomputer 920 is limited. An improvement in the design flexibility is beneficial. Further, the external component is essential in order to change the slow determination time and the fast determination time, and it may be necessary to provide the watchdog timer 910 at the external terminal 913 for connecting the external component 930.

In addition, an abnormality in which a frequency of a clock signal in the oscillation circuit 911 greatly deviates from a design frequency may occur due to aged deterioration or failure of the oscillation circuit 911. It may not be appropriate to continue monitoring the operation of the microcomputer 920 in a state where the watchdog timer 910 is abnormal, but it cannot determine the presence or absence of such an abnormality in the arithmetic processing system of FIG. 19. If the presence or absence of the abnormality can be determined, it is possible to stop the operation that is not appropriate as described above or to notify the host system of that fact, which makes beneficial.

SUMMARY

Some embodiments of the present disclosure provide a window type watchdog timer and a semiconductor device that contribute to a reduction in the number of parts or an improvement in design flexibility of a monitoring target device. In addition, some embodiments of the present disclosure provide a window type watchdog timer and a semiconductor device having a function of diagnosing the presence or absence of an abnormality of its own.

According to one embodiment of the present disclosure, there is provided a window type watchdog timer for monitoring a target device, including: an oscillation circuit configured to generate a predetermined reference clock signal; a frequency dividing circuit configured to generate a frequency-divided clock signal by dividing a frequency of the reference clock signal; a monitoring circuit configured to: monitor occurrence of a first error in which clear control from the target device is interrupted for a first time or more, and occurrence of a second error in which an interval between two consecutive clear controls from the target device is shorter than a second time, which is shorter than the first time, based on the frequency-divided clock signal; and output a predetermined error signal when the first error or the second error is detected; and a setting circuit configured to variably set the first time and the second time by variably setting a frequency division ratio in the frequency dividing circuit and variably setting a detection condition of the first error and the second error.

In the window type watchdog timer according to the present disclosure, the setting circuit may be configured to variably set a ratio between the first time and the second time.

In the window type watchdog timer according to the present disclosure, the monitoring circuit may include a counter configured to obtain a count value by counting a number of clocks of the frequency-divided clock signal, the monitoring circuit may be configured to monitor the occurrence of the first error based on the count value and a first threshold corresponding to the first time, and monitor the occurrence of the second error based on the count value and a second threshold corresponding to the second time, and the setting circuit may be configured to variably set the first time and the second time by variably setting the frequency division ratio and variably setting at least one selected from the group consisting of the first threshold and the second threshold.

In the window type watchdog timer according to the present disclosure, one of the first threshold and the second threshold may have a predetermined fixed value, the setting circuit may be configured to: set a ratio between the first time and the second time by setting one of the first threshold and the second threshold, with the other having a fixed value as a reference, based on first data indicative of a ratio between the first threshold and the second threshold; and set the first time and the second time by setting the frequency division ratio based on second data different from the first data, and the window type watchdog timer may further include a memory in which the first data and the second data are stored in a rewritable manner.

In the window type watchdog timer according to the present disclosure, the oscillation circuit may include: a first oscillation circuit configured to generate a first reference clock signal; and a second oscillation circuit configured to generate a second reference clock signal. The frequency dividing circuit may include: a first frequency dividing circuit configured to generate a first frequency-divided clock signal as the frequency-divided clock signal by dividing a frequency of the first reference clock signal; a second frequency dividing circuit configured to generate a second frequency-divided clock signal by dividing the frequency of the first reference clock signal; a third frequency dividing circuit configured to generate a third frequency-divided clock signal by dividing a frequency of the second reference clock signal; and a fourth frequency dividing circuit configured to generate a fourth frequency-divided clock signal by dividing the frequency of the second reference clock signal. The monitoring circuit may be configured to monitor the occurrence of the first error and the second error based on the first frequency-divided clock signal, the setting circuit may be configured to variably set the first time and the second time by variably setting the frequency division ratio in the first frequency dividing circuit and variably setting the detection condition of the first error and the second error, the window type watchdog timer may further include a self-diagnosis circuit configured to determine whether or not an abnormality occurs in a diagnosis target circuit including the first oscillation circuit, based on the first to fourth frequency-divided clock signals, and a frequency of the third frequency-divided clock signal may be set to be lower than a frequency of the first frequency-divided clock signal and a frequency of the fourth frequency-divided clock signal may be set to be higher than a frequency of the second frequency-divided clock signal, or the frequency of the third frequency-divided clock signal may be set to be higher than the frequency of the first frequency-divided clock signal and the frequency of the fourth frequency-divided clock signal may be set to be lower than the frequency of the second frequency-divided clock signal.

According to one embodiment of the present disclosure, there is provided a window type watchdog timer for monitoring a target device, including: a first oscillation circuit configured to generate a first reference clock signal; a first frequency dividing circuit configured to generate a first frequency-divided clock signal by dividing a frequency of the first reference clock signal; a second frequency dividing circuit configured to generate a second frequency-divided clock signal by dividing the frequency of the first reference clock signal; a second oscillation circuit configured to generate a second reference clock signal; a third frequency dividing circuit configured to generate a third frequency-divided clock signal by dividing a frequency of the second reference clock signal; a fourth frequency dividing circuit configured to generate a fourth frequency-divided clock signal by dividing the frequency of the second reference clock signal; a monitoring circuit configured to: monitor occurrence of a first error in which clear control from the target device is interrupted for a first time or more, and occurrence of a second error in which an interval between two consecutive clear controls from the target device is shorter than a second time, which is shorter than the first time, based on the first frequency-divided clock signal; and output a predetermined error signal when the first error or the second error is detected; and a self-diagnosis circuit configured to determine whether or not an abnormality occurs in a diagnosis target circuit including the first oscillation circuit, based on the first to fourth frequency-divided clock signals, wherein a frequency of the third frequency-divided clock signal is set to be lower than a frequency of the first frequency-divided clock signal and a frequency of the fourth frequency-divided clock signal is set to be higher than a frequency of the second frequency-divided clock signal, or the frequency of the third frequency-divided clock signal is set to be higher than the frequency of the first frequency-divided clock signal and the frequency of the fourth frequency-divided clock signal is set to be lower than the frequency of the second frequency-divided clock signal.

In the window type watchdog timer according to the present disclosure, the self-diagnosis circuit may include a counter part configured to: obtain first, second, third, and fourth count values by counting a number of clocks of the first, second, third, and fourth frequency-divided clock signals, respectively; and determine whether or not the abnormality occurs in the diagnosis target circuit, based on a relationship between the first count value and the third count value and a relationship between the second count value and the fourth count value.

In the window type watchdog timer according to the present disclosure, the frequency of the third frequency-divided clock signal is set to be lower than the frequency of the first frequency-divided clock signal and the frequency of the fourth frequency-divided clock signal is set to be higher than the frequency of the second frequency-divided clock signal, and the self-diagnosis circuit determines that the abnormality occurs in the diagnosis target circuit when the third count value does not reach a first determination value until the first count value reaches a first reference value, or when the second count value does not reach a second determination value until the fourth count value reaches a second reference value.

In the window type watchdog timer according to the present disclosure, the frequency of the third frequency-divided clock signal is set to be higher than the frequency of the first frequency-divided clock signal and the frequency of the fourth frequency-divided clock signal is set to be lower than the frequency of the second frequency-divided clock signal, and wherein the self-diagnosis circuit determines that the abnormality occurs in the diagnosis target circuit when the first count value does not reach a first determination value until the third count value reaches a first reference value, or when the fourth count value does not reach a second determination value until the second count value reaches a second reference value.

The window type watchdog timer according to the present disclosure may further include: a control circuit; and a start-up diagnosis circuit configured to execute a start-up diagnosis process including first to third processes, wherein the self-diagnosis circuit outputs a predetermined abnormal signal when it is determined that the abnormality occurs in the diagnosis target circuit, and outputs a predetermined normal signal when it is not determined that the abnormality occurs in the diagnosis target circuit, wherein the second oscillation circuit is configured to set the frequency of the second reference clock signal to any one of a predetermined reference frequency, a high shift frequency higher than the reference frequency, and a low shift frequency lower than the reference frequency, wherein the start-up diagnosis circuit is configured to: in the first process, set the frequency of the second reference clock signal to the high shift frequency and check whether or not the abnormal signal is output from the self-diagnosis circuit; in the second process, set the frequency of the second reference clock signal to the reference frequency and check whether or not the normal signal is output from the self-diagnosis circuit; and in the third process, set the frequency of the second reference clock signal to the low shift frequency and check whether or not the abnormal signal is output from the self-diagnosis circuit, wherein, the control circuit sets the frequency of the second reference clock signal to the reference frequency and then starts a normal operation in which the occurrence of the first error and the second error is monitored by the monitoring circuit in a case in which the abnormal signal is output in the first process, the normal signal is output in the second process, and the abnormal signal is output in the third process, and, wherein, the control circuit executes a predetermined abnormality handling process in any other case.

According to one embodiment of the present disclosure, there is provided a semiconductor device including the window type watchdog timer according to the present disclosure that is configured by a semiconductor integrated circuit.

DETAILED DESCRIPTION

Figure 1:
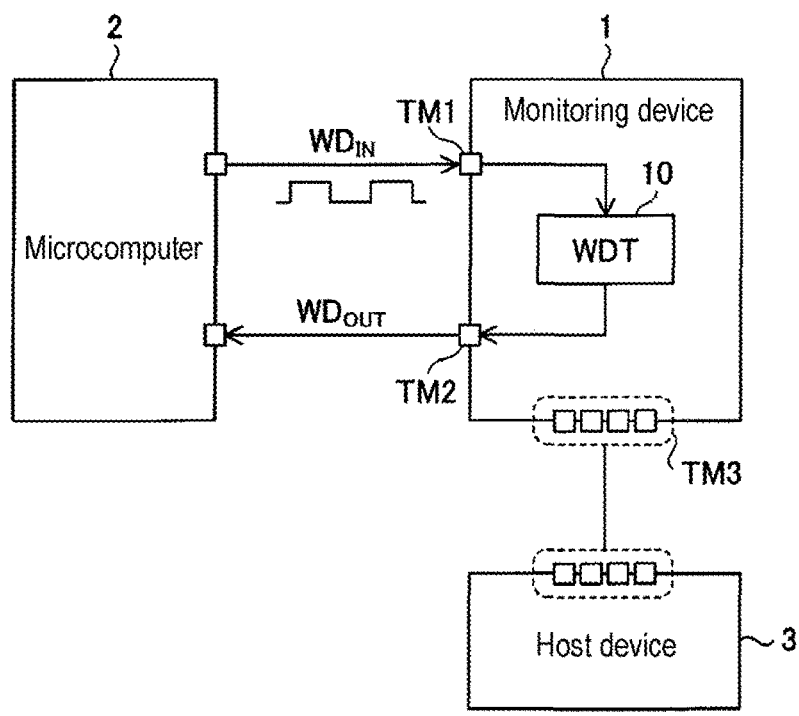
FIG. 1 is a view showing an overall configuration of an arithmetic processing system according to a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. In the present disclosure, for the purpose of simplification of description, by denoting information, signals, physical quantities, members, etc. with reference symbols or marks, the names of information, signals, physical quantities, members, etc. corresponding to the symbols or marks may be omitted or abbreviated. For example, a main reference clock signal referred to by "$CLK_M$" discussed later may be described as a main reference clock signal $CLK_M$ or abbreviated as a clock signal $CLK_M$, but they all refer to the same thing.

First, some terms used in the present embodiments will be described. A level refers to the level of a potential and a high level of any signal or voltage has a potential higher than a low level thereof. In any signal or voltage, switching from a low level to a high level is referred to as up-edge, and switching from a high level to a low level is referred to as down-edge. For any signal or voltage whose level periodically switches between a low level and a high level, the ratio of the length of an interval in which the signal or voltage is at the high level to the length of an interval of one cycle of the signal or voltage is called a duty.

First Embodiment

A first embodiment of the present disclosure will be described. FIG. 1 is a view showing an overall configuration of an arithmetic processing system according to a first embodiment of the present disclosure. The arithmetic processing system includes a monitoring device 1, a microcomputer 2 which is an example of a monitoring target device, and a host device 3.

The monitoring device 1 is provided with a plurality of terminals including an input terminal TM1, an output terminal TM2 and a communication terminal TM3. The monitoring device 1 is connected to the microcomputer 2 via the input terminal TM1 and the output terminal TM2, and is connected to the host device 3 via the communication terminal TM3. The communication terminal TM3 may be composed of a plurality of terminals.

The microcomputer 2 executes arithmetic processing according to a predetermined program by executing the predetermined program. At this time, the microcomputer 2 is configured to periodically perform predetermined clear control on the monitoring device 1. The clear control is performed using a signal $WD_{IN}$ output from the microcomputer 2. The signal $WD_{IN}$ is input to the input terminal TM1.

Figure 2A:
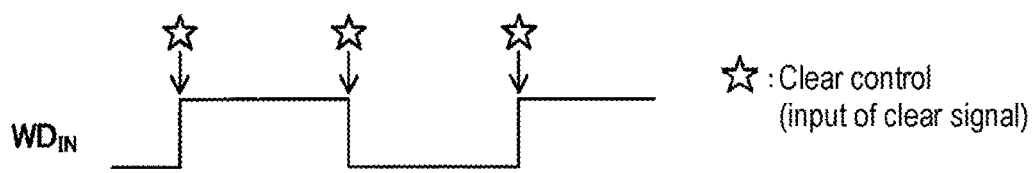
FIGS. 2A and 2B are views showing examples of a waveform of an output signal from a microcomputer of FIG. 1 to a monitoring device of FIG. 1.
Figure 2B:
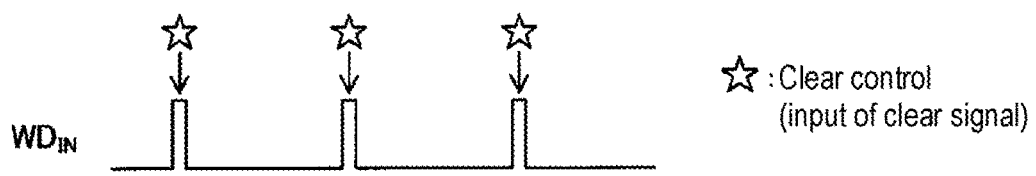

FIG. 2A shows an example of a waveform of the signal $WD_{IN}$. In normal operation of the microcomputer 2, the microcomputer 2 outputs a rectangular wave signal having a duty of 50% as the signal $WD_{IN}$. At this time, switching the level of the signal $WD_{IN}$ from a low level to a high level corresponds to the clear control, and switching the level of the signal $WD_{IN}$ from the high level to the low level also corresponds to the clear control. However, only the occurrence of an up-edge of the signal $WD_{IN}$ may correspond to the clear control, or only the occurrence of a down-edge of the signal $WD_{IN}$ may correspond to the clear control. In this case, as shown in FIG. 2B, the microcomputer 2 may periodically include a pulse in the signal $WD_{IN}$. The pulse refers to a rectangular wave in which its signal level returns from a high level to a low level after a predetermined short time after the signal level is switched from the low level to the high level.

It is understood that the execution of the clear control corresponds to an input of a clear signal to the monitoring device 1. That is, for example, with respect to the waveform of FIG. 2A, the occurrence of the up-edge of the signal $WD_{IN}$ corresponds to the input of the clear signal, and the occurrence of the down-edge of the signal $WD_{IN}$ also corresponds to the input of the clear signal. With respect to the waveform of FIG. 2B, only one of the occurrence of the up-edge of the signal WDIN and the occurrence of the down-edge of the signal WDIN corresponds to the input of the clear signal.

The monitoring device 1 monitors whether or not the microcomputer 2 is operating normally, based on the signal $WD_{IN}$ (monitors whether or not the microcomputer 2 is runaway), and outputs the monitoring result as a signal $WD_{OUT}$ from the output terminal TM2. When the monitoring device 1 determines that the microcomputer 2 is not operating normally, the monitoring device 1 includes a predetermined error signal in the signal $WD_{OUT}$ and outputs it from the output terminal TM2.

Figure 3:
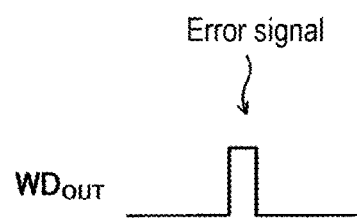
FIG. 3 is a view showing an example of a waveform of an output signal from the monitoring device of FIG. 1 to the microcomputer of FIG. 1.

FIG. 3 shows an example of a waveform of the signal $WD_{OUT}$. The signal $WD_{OUT}$ is maintained at a low level in principle, and an error signal in FIG. 3 corresponds to a high level signal included in the signal $WD_{OUT}$. In this case, when it is determined that the microcomputer 2 is not operating normally, the monitoring device 1, for example, outputs an error signal by switching the level of the signal $WD_{OUT}$ from a low level to a high level, and stops the output of the error signal (that is, returns the level of the signal $WD_{OUT}$ to the low level) after a predetermined time has elapsed. Alternatively, the output of the error signal may be continued until a predetermined signal is input from the microcomputer 2 or the host device 3. The error signal described above is merely an example, and the form of the error signal may be arbitrary.

The error signal may be input to the microcomputer 2 as a reset signal for restarting the microcomputer 2. When the microcomputer 2 receives the reset signal, the operation of the microcomputer 2 is stopped at once and the microcomputer 2 is restarted. That is, when the microcomputer 2 receives the reset signal during execution of a predetermined program, the execution of the program is terminated and then is started again from the beginning. Although different from the situation shown in FIG. 1, the signal $WD_{OUT}$ which may include an error signal may be output to the host device 3.

The monitoring device 1 and the host device 3 can perform two-way communications via the communication terminal TM3. Here, it is assumed that signals can be transmitted and received by SPI (Serial Peripheral Interface) communication between the monitoring device 1 and the host device 3 via the communication terminal TM3. However, the communication method is not limited to SPI.

Figure 4:
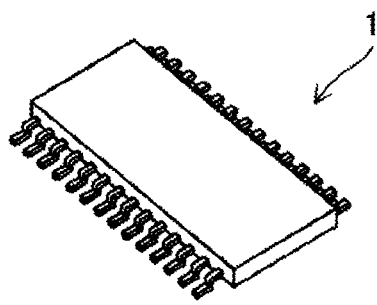
FIG. 4 is an external perspective view of the monitoring device of FIG. 1.

FIG. 4 shows an example of an external appearance of the monitoring device 1. Each circuit constituting the monitoring device 1 is integrated with semiconductors, namely, is formed of a semiconductor integrated circuit. The monitoring device 1 corresponds to a semiconductor device (electronic component) formed by enclosing a semiconductor integrated circuit in a housing (package) made of resin, or is included in a component of the semiconductor device. The housing of the semiconductor device including the monitoring device 1 is provided with a plurality of external terminals exposed from the housing to the outside of the semiconductor device. The plurality of external terminals include the above-described input terminal TM1, output terminal TM2, and communication terminal TM3. The number of external terminals shown in FIG. 4 is merely an example, and the type of the casing is arbitrary. Moreover, some or all of the circuit constituting the monitoring device 1 may be configured using discrete components.

The monitoring device 1 contains a watchdog timer (hereinafter referred to as a WDT) 10 that monitors whether or not the microcomputer 2 is operating normally. The WDT 10 in the monitoring device 1 is a so-called window type WDT. Therefore, the WDT 10 monitors whether or not a following slow error and fast error occur, and outputs an error signal from the output terminal TM2 when the slow error or a fast error is detected.

Figure 5A:
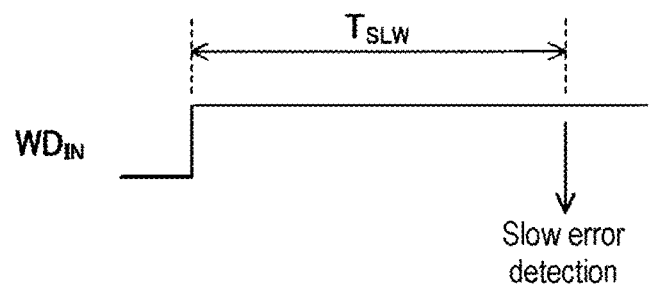
FIGS. 5A and 5B are explanatory views of a slow error and a fast error whose occurrence is monitored by a watchdog timer according to the first embodiment of the present disclosure.

As shown in FIG. 5A, a slow error refers to an error in which the clear control from the microcomputer 2 is interrupted for a predetermined slow determination time $T_{SLW}$ or more (in FIG. 5A, it is assumed that the signal $WD_{IN}$ of the type shown in FIG. 2A is input; the same applies to FIG. 5B to be described later). Therefore, after receiving the clear signal input from the microcomputer 2, the WDT 10 waits for the next clear signal to be input. If the next clear signal is not input even after the predetermined slow determination time $T_{SLW}$ has elapsed, the WDT 10 determines and detects that a slow error has occurred.

Figure 5B:
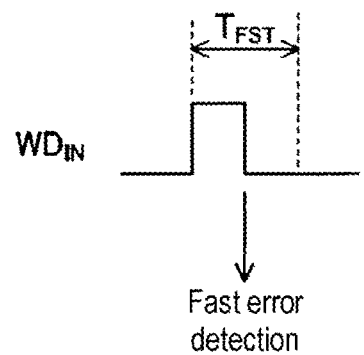

As shown in FIG. 5B, a fast error refers to an error in which the interval between two consecutive clear controls from the microcomputer 2 is shorter than a predetermined fast determination time $T_{FST}$. Therefore, after receiving the clear signal input from the microcomputer 2, the WDT 10 waits for the next clear signal to be input. When the next clear signal is input before the predetermined fast determination time $T_{FST}$ has elapsed, the WDT 10 determines and detects that a fast error has occurred.

The slow determination time $T_{SLW}$ is longer than the fast determination time $T_{FST}$. When the microcomputer 2 is operating normally, the microcomputer 2 executes clear control on the monitoring device 1 at regular intervals shorter than the slow determination time $T_{SLW}$ and longer than the fast determination time $T_{FST}$. Therefore, when the microcomputer 2 is operating normally, neither a slow error nor a fast error is detected. However, when program freeze or runaway occurs, a slow error or a fast error is detected.

Figure 6:
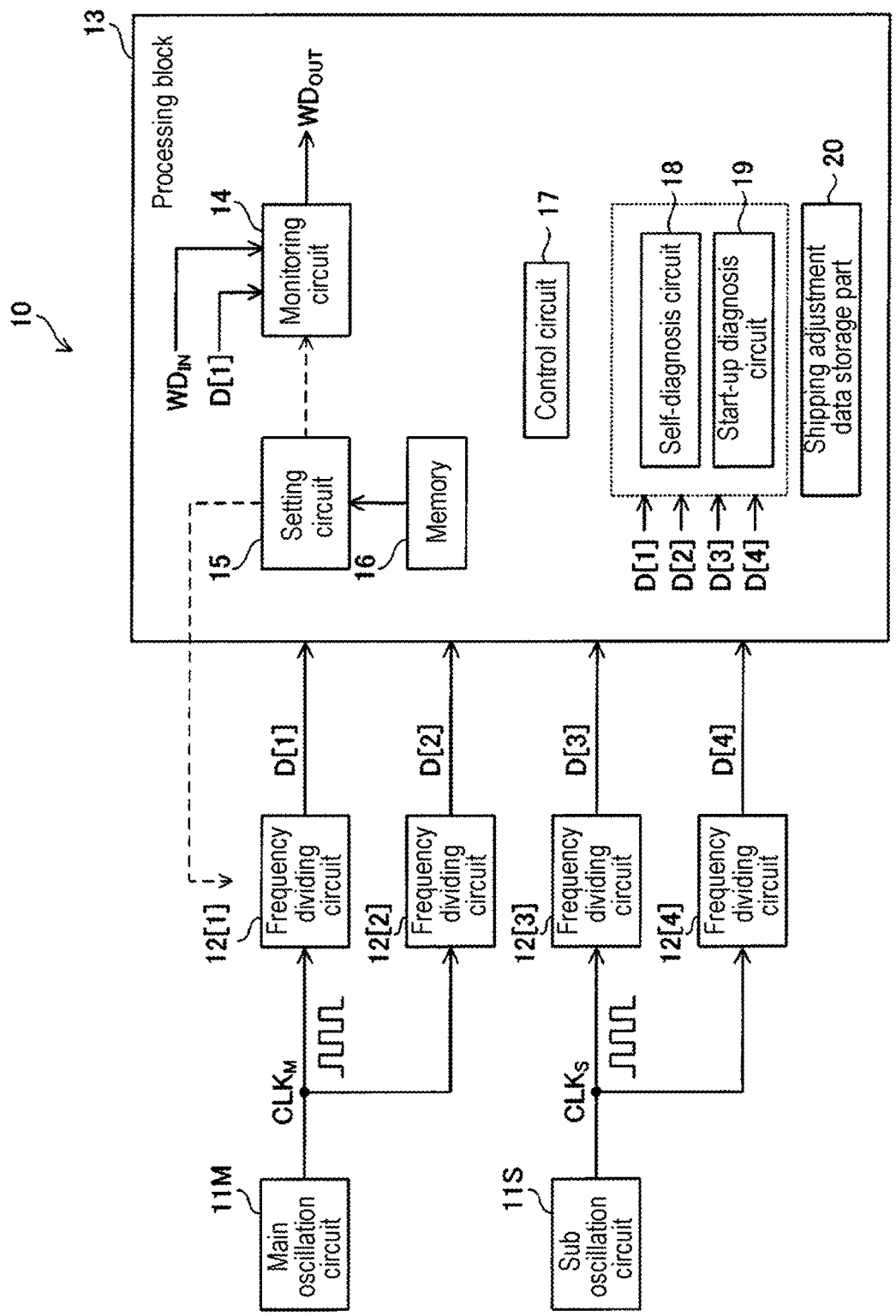
FIG. 6 is a view showing a configuration of the watchdog timer according to the first embodiment of the present disclosure.

FIG. 6 is a block diagram showing a configuration of the WDT 10. The WDT 10 includes a main oscillation circuit 11M, a sub oscillation circuit 11S, frequency dividing circuits 12[1] to 12[4], and a processing block 13.

The main oscillation circuit 11M generates and outputs a main reference clock signal $CLK_M$ having a predetermined first reference frequency. The sub oscillation circuit 11S generates and outputs a sub reference clock signal $CLK_S$ having a predetermined second reference frequency. An arbitrary clock signal, which includes the clock signals $CLK_M$ and $CLK_S$, is a rectangular wave signal whose signal level alternates between a low level and a high level, and usually has a duty of 50%. The first reference frequency and the second reference frequency may coincide with each other or may differ from each other.

The frequency dividing circuit 12[1] generates a frequency-divided clock signal D[1] by dividing the frequency of the main reference clock signal $CLK_M$. The frequency dividing circuit 12[2] generates a frequency-divided clock signal D[2] by dividing the frequency of the main reference clock signal $CLK_M$. The frequency division ratios of the frequency dividing circuits 12[1] and 12[2] are different from each other, which will be described later. The frequency division ratio of one of the frequency dividing circuits 12[1] and 12[2] may be "1." When the frequency division ratio of the frequency dividing circuit 12[1] is "1," the frequency-divided clock signal D[1] has the same frequency as the main reference clock signal $CLK_M$ (the same applies to the frequency dividing circuit 12[2]).

The frequency dividing circuit 12[3] generates a frequency-divided clock signal D[3] by dividing the frequency of the sub reference clock signal $CLK_S$. The frequency dividing circuit 12[4] generates a frequency-divided clock signal D[4] by dividing the frequency of the sub reference clock signal $CLK_S$. The frequency division ratios of the frequency dividing circuits 12[3] and 12[4] are different from each other, which will be described later. The frequency division ratio of one of the frequency dividing circuits 12[3] and 12[4] may be "1." When the frequency division ratio of the frequency dividing circuit 12[3] is "1," the frequency-divided clock signal D[3] has the same frequency as the sub reference clock signal $CLK_S$ (the same applies to the frequency dividing circuit 12[4]).

The processing block 13 includes a monitoring circuit 14, a setting circuit 15, a memory 16, a control circuit 17, a self-diagnosis circuit 18, a start-up diagnosis circuit 19, and a shipping adjustment data storage part 20.

The monitoring circuit 14 monitors whether or not a slow error and a fast error occur, based on the signal $WD_{IN}$ and the frequency-divided clock signal D[1], and outputs a signal $WD_{OUT}$ based on the monitoring result. When the occurrence of the slow error or the fast error is detected, an error signal is included in the signal $WD_{OUT}$ as described above and is output from the output terminal TM2.

The control circuit 17 generally controls the operation of the processing block 13. The functions of the setting circuit 15, the memory 16, the self-diagnosis circuit 18, the start-up diagnosis circuit 19, and the shipping adjustment data storage part 20 will be described later.

Detailed examples, application examples and modifications of the above-described configuration and operation will be described in the following second to fifth embodiments. The matters described above in the first embodiment are applied to the following second to fifth embodiments unless otherwise specified or contradictory. In each of the following embodiments, the description in each of the following embodiments may be given priority for matters that contradict the description in the first embodiment. As long as there is no contradiction, the matters described in any of the first to fifth embodiments can be applied to any other embodiments (that is, any two or more of the plurality of embodiments may be used in combination).

Second Embodiment

A second embodiment of the present disclosure will be described. The second embodiment involves a method of variably setting the slow determination time $T_{SLW}$ and the fast determination time $T_{FST}$. When the second embodiment is aimed to realize this method only, the sub oscillation circuit 11S, the frequency dividing circuits 12[2] to 12[4], the self-diagnosis circuit 18, and the start-up diagnosis circuit 19 are unnecessary and may be excluded from the WDT 10.

The setting circuit 15 variably sets the frequency division ratio of the frequency dividing circuit 12[1] based on the stored contents of the memory 16, and also variably sets the conditions for detection of the slow error and the fast error by the monitoring circuit 14, thereby variably setting the slow determination time $T_{SLW}$ and the fast determination time $T_{FST}$. At this time, for example, the ratio between the slow determination time $T_{SLW}$ and the fast determination time $T_{FST}$ may be variably set. These settings will be described in more detail below.

Figure 7:
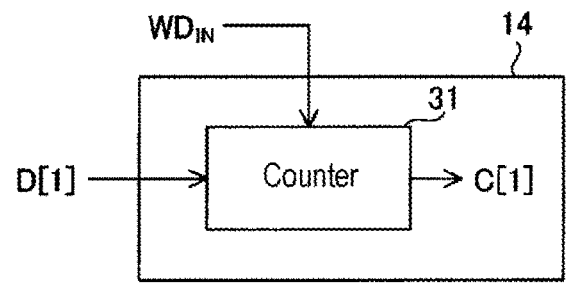
FIG. 7 is a view showing an internal configuration of a monitoring circuit according to a second embodiment of the present disclosure.

As shown in FIG. 7, the monitoring circuit 14 is provided with a counter 31. The counter 31 counts the number of clocks of the frequency-divided clock signal D[1] and generates the counted number of clocks as a count value C[1].

Regarding an arbitrary clock signal including the frequency-divided clock signal D[1], the number of clocks represents the number of up-edges generated in the clock signal or the number of down-edges generated in the clock signal. Here, for the sake of concrete description, the number of clocks is represented by the number of up-edges generated in the clock signal (the same applies to any number of clocks to be described later). Then, whenever an up-edge occurs in the frequency-divided clock signal D[1], "1" is added to the count value C[1].

The counter 31 is supplied with the signal $WD_{IN}$. The counter 31 refers to the signal $WD_{IN}$ to reset the count value C[1] in response to the input of the clear signal. Regarding an arbitrary count value including the count value C[1], resetting the count value means substituting "0" into the count value. Therefore, "0" is substituted into the count value C[1] each time a clear signal is input.

Figure 8:
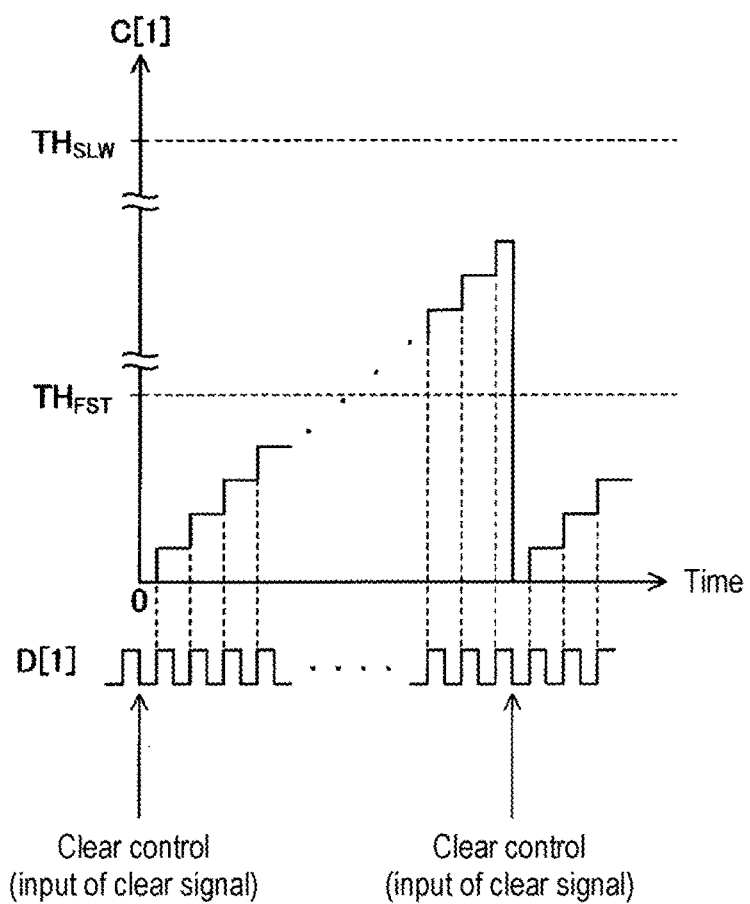
FIG. 8 is a view showing a relationship between a frequency-divided clock signal, a count value, and a clear signal related to the monitoring circuit according to the second embodiment of the present disclosure.

FIG. 8 shows a relationship between the frequency-divided clock signal D[1], the count value C[1], and a clear signal. A slow determination threshold $TH_{SLW}$ corresponding to the slow determination time $T_{SLW}$ and a fast determination threshold $TH_{FST}$ corresponding to the fast determination time $T_{FST}$ are determined for the count value C[1].

When the count value C[1] reaches the slow determination threshold $TH_{SLW}$, this means that the clear control (input of the clear signal) from the microcomputer 2 has been interrupted for the predetermined slow determination time $T_{SLW}$. Therefore, when the count value C[1] reaches the slow determination threshold value $TH_{SLW}$, the monitoring circuit 14 determines that a slow error has occurred. At this time, as described above, an error signal is included in the signal $WD_{OUT}$ and is output from the output terminal TM2.

When the count value C[1] is reset before the count value C[1] reaches the fast determination threshold value $TH_{SLW}$, this means that the interval between two consecutive clear controls (input interval between two adjacent clear signals) from the microcomputer 2 is shorter than the predetermined fast determination time $T_{FST}$. Therefore, before the count value C[1] reaches the fast determination threshold $TH_{SLW}$ after the count value C[1] is reset in response to the input of the clear signal, when the clear signal is again input to reset the count value C[1], the monitoring circuit 14 determines that a fast error has occurred. At this time, as described above, an error signal is included in the signal $WD_{OUT}$ and is output from the output terminal TM2.

As understood from the above description, the slow determination time $T_{SLW}$ is represented by a product of the period of the frequency-divided clock signal D[1] and the slow determination threshold $TH_{SLW}$, and the fast determination time $T_{FST}$ is represented by a product of the period of the frequency-divided clock signal D[1] and the fast determination threshold $TH_{FST}$.

The frequency dividing circuit 12[1] is configured so that the frequency division ratio is variably set when the frequency-divided clock signal D[1] is generated from the main reference clock signal $CLK_M$. The setting circuit 15 controls and sets the frequency division ratio of the frequency dividing circuit 12[1] based on frequency division ratio setting data DTa stored in the memory 16 (see FIG. 9). The frequency division ratio setting data DTa is data designating the frequency division ratio of the frequency dividing circuit 12[1]. When the ratio between the frequency of the clock signal before being frequency-divided (the main reference clock signal $CLK_M$ for the frequency dividing circuit 12[1]) and the frequency of the clock signal after being frequency-divided (the frequency-divided clock signal D[1] for the frequency dividing circuit 12[1]) is represented by "N:1," the frequency division ratio in the frequency division is "N" (N is an integer of 2 or more). When the frequency division ratio of the frequency dividing circuit 12[1] is changed, the slow determination time $T_{SLW}$ and the fast determination time $T_{FST}$ change while the ratio between the slow determination time $T_{SLW}$ and the fast determination time $T_{FST}$ is fixed.

Figure 9:
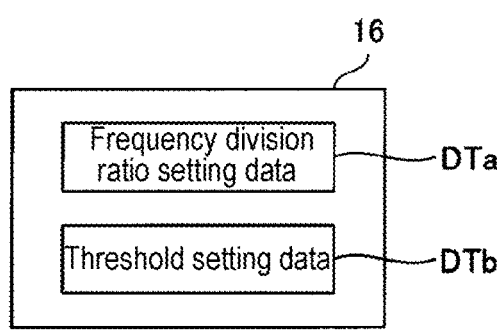
FIG. 9 is an explanatory view of data stored in a memory according to the second embodiment of the present disclosure.

Further, the setting circuit 15 variably sets at least one of the slow determination threshold $TH_{SLW}$ and the fast determination threshold $TH_{FST}$ based on threshold setting data DTb stored in the memory 16 (see FIG. 9). Thereby, the ratio between the slow determination time $T_{SLW}$ and the fast determination time $T_{FST}$ is variably set.

The host device 3 can freely change the frequency division ratio setting data DTa and the threshold setting data DTb stored in the memory 16 by transmitting a predetermined setting signal to the monitoring device 1 via the communication terminal TM3. The memory 16 may be any storage means that stores the data DTa and DTb in a changeable manner. For example, the memory 16 may be a volatile memory such as a register, or may be a nonvolatile memory such as an EEPROM (Electrically Erasable Programmable Read-Only Memory).

The threshold setting data DTb may be data designating a ratio between the determination thresholds $TH_{SLW}$ and $TH_{FST}$ (in other words, a ratio between the determination times $T_{SLW}$ and $T_{FST}$). For convenience, a method of setting data designating a ratio between the determination thresholds $TH_{SLW}$ and $TH_{FST}$ as the threshold setting data DTb is referred to as a ratio data setting method.

Figure 10:
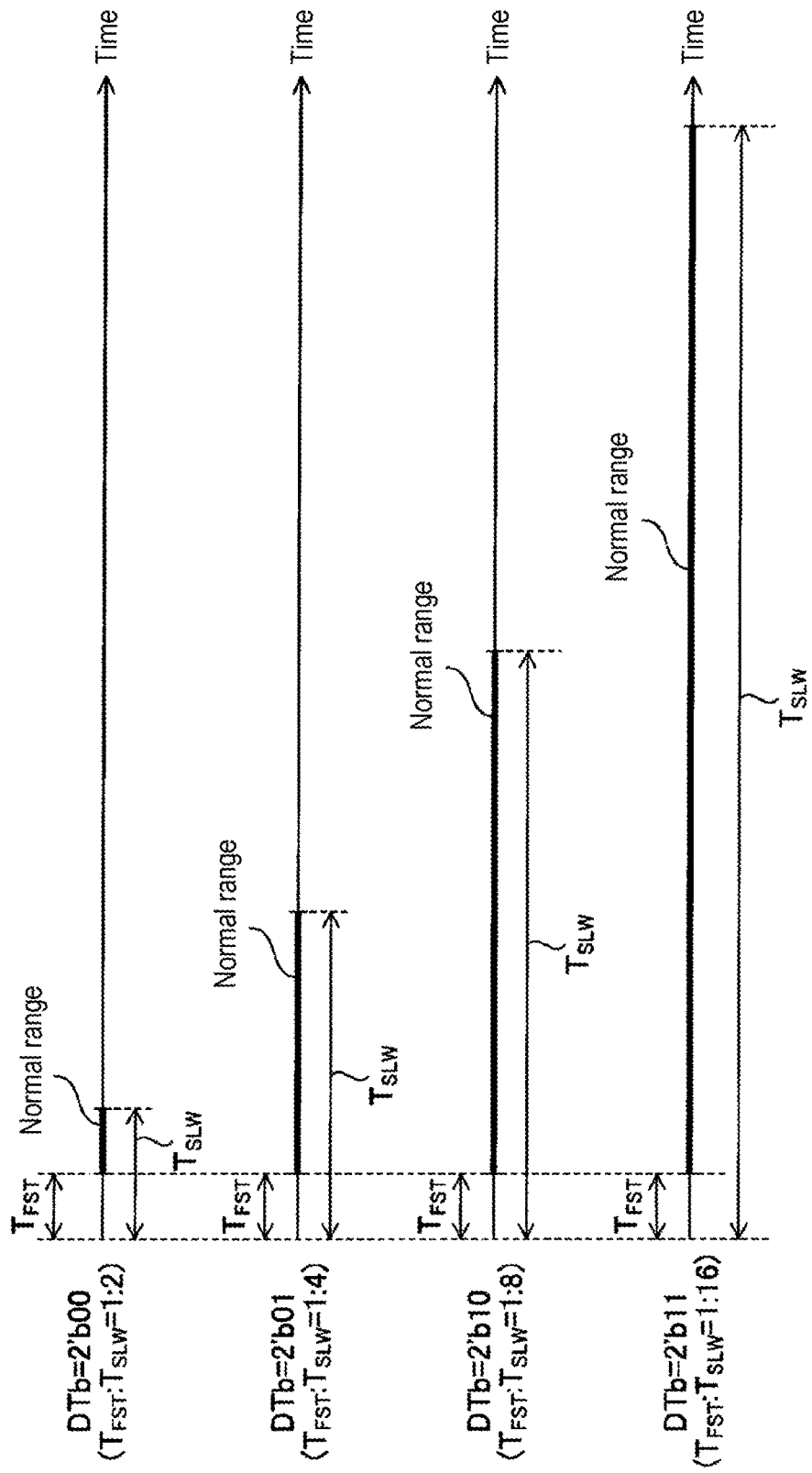
FIG. 10 is a view for explaining a method for setting a fast determination time and a slow determination time based on threshold setting data according to the second embodiment of the present disclosure.

FIG. 10 shows an example of a relationship between the determination times TSLW and TFST when the ratio data setting method is used and the ratio is varied in four steps. In the example of FIG. 10, the determination threshold $TH_{FST}$ has a predetermined fixed value, and the threshold setting data DTb is composed of 2-bit digital data and takes any one of the values "00," "01," "10," and "11" in binary notation. Then, when the threshold setting data DTb is "00," the ratio between the determination threshold $TH_{FST}$ and the determination threshold $TH_{SLW}$ is set to "1:2," so that the ratio between the determination time $T_{FST}$ and the determination time $T_{SLW}$ is "1:2."

When the threshold setting data DTb is "01," the ratio between the determination threshold $TH_{FST}$ and the determination threshold $TH_{SLW}$ is set to "1:4," so that the ratio between the determination time $T_{FST}$ and the determination time $T_{SLW}$ is "1:4."

When the threshold setting data DTb is "10," the ratio between the determination threshold $TH_{FST}$ and the determination threshold $TH_{SLW}$ is set to "1:8," so that the ratio between the determination time $T_{FST}$ and the determination time $T_{SLW}$ is "1:8."

When the threshold setting data DTb is "11," the ratio between the determination threshold $TH_{FST}$ and the determination threshold $TH_{SLW}$ is set to "1:16," so that the ratio between the determination time $T_{FST}$ and the determination time $T_{SLW}$ is "1:16."

When such a ratio data setting method is used, the division ratio setting can be performed in an efficient manner and the required capacity of the memory 16 can be reduced.

The method of implementing the ratio data setting method is not limited to the example shown in FIG. 10. Therefore, when the ratio data setting method is used, the number of variable steps of the ratio between the determination times $T_{SLW}$ and $T_{FST}$ may be other than four, and the method of varying the ratio is not limited to the method of using a power of 2 as shown in FIG. 10. That is, for example, the monitoring circuit 14 and the setting circuit 15 may be configured so that, according to the threshold setting data DTb, the ratio between the determination time $T_{FST}$ and the determination time $T_{SLW}$ is any of "1:2," "1:3," "1:4," "1:5," and "1:6."

Further, when the ratio data setting method is used and the fast determination threshold $TH_{FST}$ has a predetermined fixed value as in the example of FIG. 10, the slow determination threshold $TH_{SLW}$ is variably set according to the threshold setting data DTb with the fast determination threshold $TH_{FST}$ as a reference. However, when the slow determination threshold $TH_{SLW}$ has a predetermined fixed value instead of the fast determination threshold $TH_{FST}$, the fast determination threshold $TH_{FST}$ may be variably set according to the threshold setting data DTb with the slow determination threshold $TH_{SLW}$ as a reference.

As such, when the ratio data setting method is used, one of the slow determination threshold $TH_{SLW}$ and the fast determination threshold $TH_{FST}$ has a predetermined fixed value, and, based on the threshold setting data DTb designating the ratio between the determination thresholds $TH_{SLW}$ and $TH_{FST}$, the setting circuit 15 sets one of the determination thresholds $TH_{SLW}$ and $TH_{FST}$ with the other having a fixed value as a reference, thereby variably setting the ratio between the determination times $T_{SLW}$ and $T_{FST}$. In addition, the setting circuit 15 controls and sets the frequency division ratio of the frequency dividing circuit 12[1] based on the frequency division ratio setting data DTa, thereby setting the determination times $T_{SLW}$ and $T_{FST}$ (that is, setting the length of each of the determination times $T_{SLW}$ and $T_{FST}$).

The setting circuit 15 may use a method other than the ratio data setting method. For example, the threshold setting data DTb may be data individually designating the determination thresholds $TH_{SLW}$ and $TH_{FST}$, in which case, the setting circuit 15 variably sets the determination thresholds $TH_{SLW}$ and $TH_{FST}$ individually according to the threshold setting data DTb.

According to the second embodiment, external components such as a resistor and a capacitor are not required (and therefore, external terminals for connecting the external components are not required), and a slow determination time and a fast determination time for determining a slow error and a fast error can be easily and variably set. When a window type WDT is configured using external components such as a resistor and a capacitor, the slow determination time and the fast determination time may be changed by changing the resistance value of the resistor or the capacitance value of the capacitor. In such case, however, the slow determination time and the fast determination time increase or decrease at the same magnification or rate, and the ratio between the slow determination time and the fast determination time remains unchanged. In contrast, when the method of the second embodiment is used, the ratio between the slow determination time and the fast determination time becomes variable, thereby increasing the degree of freedom in designing the microcomputer 2 or a degree of freedom in designing the entire system including the microcomputer 2.

Third Embodiment

A third embodiment of the present disclosure will be described. The third embodiment involves a self-diagnosis process executed by the self-diagnosis circuit 18 of FIG. 6. The self-diagnosis process is a process for determining whether or not there is an abnormality in a diagnosis target circuit based on the frequency-divided clock signals D[1] to D[4], and the self-diagnosis circuit 18 can continuously execute the self-diagnosis process after the monitoring device 1 including the WDT 10 is started. In other words, the determination as to whether there is an abnormality in the diagnosis target circuit is a determination as to whether the diagnosis target circuit is normal or abnormal.

The diagnosis target circuit includes at least the main oscillation circuit 11M. If the frequency of the main reference clock signal $CLK_M$ deviates from a designed frequency (i.e., the first reference frequency) to such an extent that a problem occurs, for example, due to aging or failure of the main oscillation circuit 11M, the WDT 10 cannot correctly monitor the operation of microcomputer 2. The self-diagnosis process can diagnose the presence or absence of such a deviation. However, in this diagnosis, as will be described later, when the sub oscillation circuit 11S is used, even if the main oscillation circuit 11M is normal and the sub oscillation circuit 11S is abnormal, the diagnosis target circuit is determined to be abnormal. Therefore, it can be considered that the sub oscillation circuit 11S is also included in the diagnosis target circuit. Further, since the self-diagnosis process is executed based on the frequency-divided clock signals D[1] to D[4], even if an abnormality occurs in any of the frequency dividing circuits 12[1] to 12[4], it can be determined that there is an abnormality in the diagnosis target circuit. Therefore, it can be considered that the frequency dividing circuits 12[1] to 12[4] are also included in the diagnosis target circuit.

Figure 11:
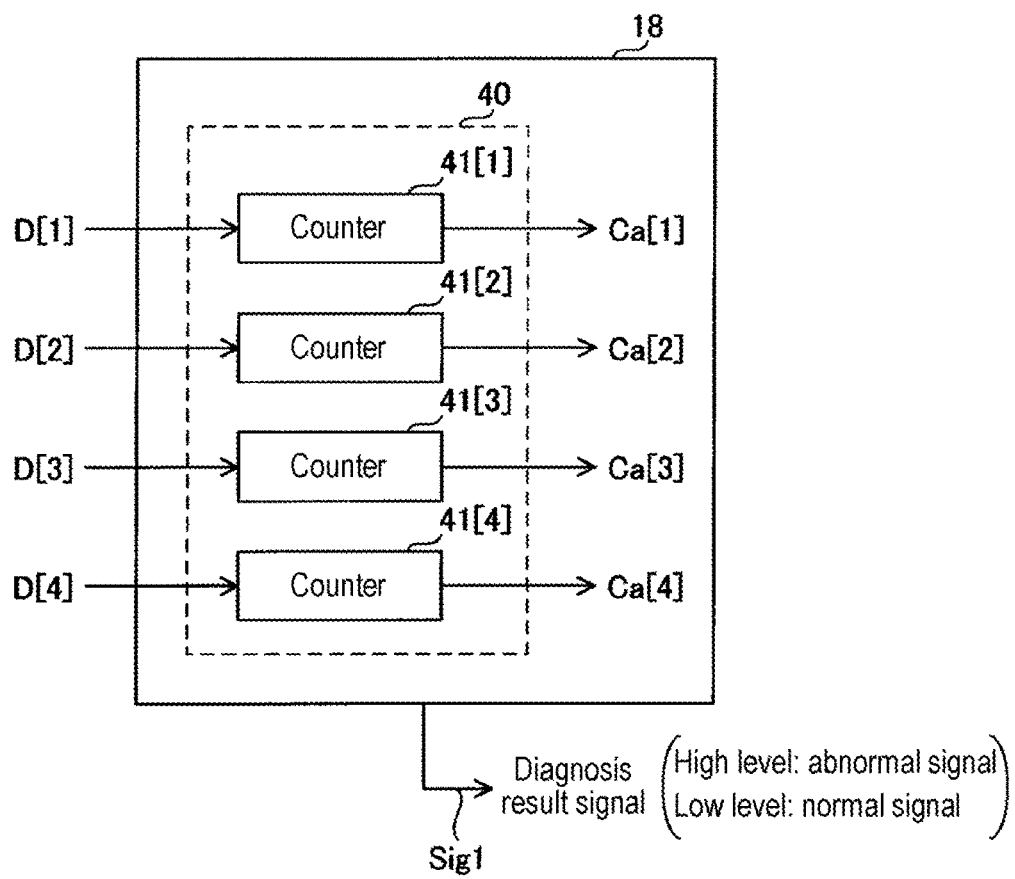
FIG. 11 is a view showing the internal configuration of a self-diagnosis circuit according to a third embodiment of the present disclosure.

As shown in FIG. 11, the self-diagnosis circuit 18 is provided with a counter part 40 including counters 41[1] to 41[4]. Each of the counters in the counter part 40 counts the number of clocks of a corresponding frequency-divided clock signal and generates the counted number of clocks as a count value. The frequency-divided clock signals corresponding to the counters 41[1] to 41[4] are the frequency-divided clock signals D[1] to D[4], respectively. That is, a counter 41[i] counts the number of clocks of a frequency-divided clock signal D[i] and generates the counted number of clocks as a count value Ca[i] (i is an integer).

A counter trigger signal is simultaneously input to the counters 41[1] to 41[4]. Since the counters 41[1] to 41[4] have the same operation, a counter operation will be described by focusing on the counter 41[i] (i is an integer) indicating any one of the counters 41[1] to 41[4]. The counter 41[i] resets the count value Ca[i] (that is, substitutes "0" into the count value Ca[i]) in response to an input of a count trigger signal, and then adds "1" to the count value Ca[i] each time an up-edge occurs in the frequency-divided clock signal D[i].

Figure 12:
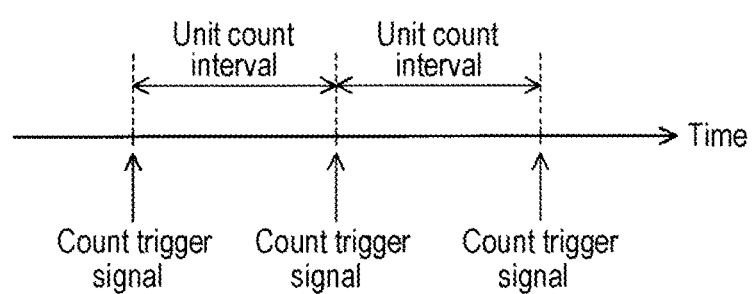
FIG. 12 is a view showing a relationship between a count trigger signal and a unit count interval according to the third embodiment of the present disclosure.

As shown in FIG. 12, the count trigger signal is periodically and repeatedly input to the counters 41[1] to 41[4], and the count operation described above is executed each time the count trigger signal is input. An interval from the input timing of a certain count trigger signal to the input timing of the next count trigger signal is referred to as a unit count interval for the sake of convenience. The self-diagnosis circuit 18 can generate the count trigger signal based on the clock signals $CLK_M$, $CLK_S$, and D[1] to D[4] or based on different clock signals. Alternatively, the self-diagnosis circuit 18 may generate the count trigger signal based on the clear signal in the signal $WD_{IN}$.

The self-diagnosis circuit 18 determines whether or not there is an abnormality in the diagnosis target circuit (in other words, determines whether the diagnosis target circuit is normal or abnormal), based on the relationship between the count value Ca[1] and the count value Ca[3] and the relationship between the count value Ca[2] and the count value Ca[4], and outputs a diagnosis result signal Sig1 indicating the result of the determination as to whether or not there is an abnormality in the diagnosis target circuit. The self-diagnosis circuit 18 may execute such determination and output of the diagnosis result signal Sig1 for each unit count interval. The diagnosis result signal Sig1 represents either an abnormal signal or a normal signal. Here, it is assumed that the diagnostic result signal Sig1 is a one-bit digital signal, with a high level diagnostic result signal Sig1 indicating an abnormal signal and a low level diagnostic result signal Sig1 indicating a normal signal (see FIG. 11). The diagnosis result signal Sig1 is input to the control circuit 17 (see FIG. 6) in the processing block 13. The control circuit 17 can execute a predetermined process based on the diagnosis result signal Sig1 (which will be described in detail later in other embodiments).

In order to realize the self-diagnosis process, it is necessary to satisfy either a first frequency condition or a second frequency condition to be described later. A specific method of the above-described determination differs between when the first frequency condition is satisfied and when the second frequency condition is satisfied. Therefore, for specific description of the method, Example EX3_1 that satisfies the first frequency condition and Example EX3_2 that satisfies the second frequency condition will be described separately.

Example EX3_1

Example EX3_1 will be described. In Example EX3_1, the self-diagnosis process is executed after the first frequency condition is satisfied. The first frequency condition is that the frequency of the frequency-divided clock signal D[3] is set to be lower than the frequency of the frequency-divided clock signal D[1] and the frequency of the frequency-divided clock signal D[4] is set to be higher than the frequency of the frequency-divided clock signal D[2].

Figure 13:
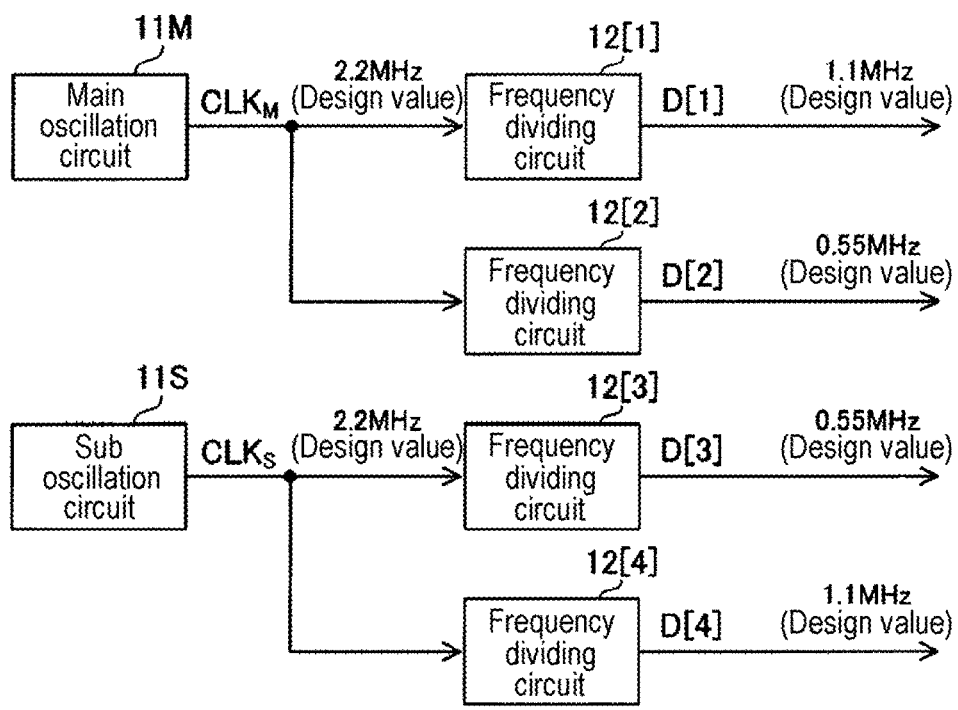
FIG. 13 is a view showing a specific example of the frequency of each clock signal according to the third embodiment of the present disclosure.

The self-diagnosis process according to Example EX3_1 will be described with specific numerical examples with reference to FIG. 13. FIG. 13 shows a specific example of the frequency of each clock signal when the oscillation circuits 11M and 11S and the frequency dividing circuits 12[1] to 12[4] are operating as designed with no abnormality in these circuits. Here, it is assumed that the first reference frequency, which is the design value of the frequency of the main reference clock signal $CLK_M$, and the second reference frequency, which is the design value of the frequency of the sub reference clock signal $CLK_S$, are both 2.2 MHz (megahertz). However, these design values may be different from each other.

In Example EX3_1, the frequency division ratios of the frequency dividing circuits 12[1] to 12[4] are set so as to satisfy the above-mentioned first frequency condition. Here, it is assumed that the frequency division ratios of the frequency dividing circuits 12[1] to 12[4] are 2, 4, 4, and 2, respectively. Then, the design values of the frequencies of the frequency-divided clock signals D[1] to D[4] are 1.1 MHz, 0.55 MHz, 0.55 MHz, and 1.1 MHz, respectively.

Whether or not the third embodiment is implemented in combination with the second embodiment is arbitrary. When the combination of the second embodiment and the third embodiment is not considered, the frequency division ratios of the frequency dividing circuits 12[1] to 12[4] may be fixed. However, when both the method shown in the second embodiment and the method shown in the third embodiment are to be realized by the WDT 10, the frequency division ratio of the frequency dividing circuit 12 [1] is variably set based on the frequency ratio setting data DTa as shown in the second embodiment. Therefore, in order to satisfy the first frequency condition after realizing the variable setting of the frequency division ratio of the frequency dividing circuit 12[1], the frequency dividing circuits 12[2] to 12[4] may be configured so that the frequency division ratios of the frequency dividing circuits 12[2] to 12[4] are also variable. For example, unlike the configuration of FIG. 13, in a case where the frequency division ratio of the frequency dividing circuit 12[1] is set to "4" based on the frequency division ratio setting data DTa, the frequency division ratios of the frequency dividing circuits 12[2] to 12[4] may be set to "8", "8," and "4", respectively. At this time, the control and setting of the frequency division ratios of the frequency dividing circuits 12[1] to 12[4] are realized by the setting circuit 15.

The self-diagnosis circuit 18 can determine whether or not there is an abnormality in the diagnosis target circuit based on the relationship between the count value Ca[1] and the count value Ca[3] in each unit count interval. Specifically, the self-diagnosis circuit 18 has a function of comparing the count value Ca[1] with a predetermined first reference value $VAL_{A1}$ and a function of comparing the count value Ca[3] with a predetermined first determination value $VAL_{B1}$. In each unit count interval, when the count value Ca[3] does not reach the first determination value $VAL_{B1}$ until the count value Ca[1] reaches the first reference value $VAL_{A1}$, the self-diagnosis circuit 18 determines that there is an abnormality in the diagnosis target circuit.

When the diagnosis target circuit is normal, in the example of the frequency design value shown in FIG. 13, the count value Ca[1] may be about twice the count value Ca[3] in each unit count interval. Therefore, for example, ($VAL_{A1}$, $VAL_{B1}$)=(1,000, 490).

In each unit count interval, when the count value Ca[3] does not reach the first determination value $VAL_{B1}$ until the count value Ca[1] reaches the first reference value $VAL_{A1}$, it is presumed that either a main fast abnormality or a sub slow abnormality has occurred in the diagnosis target circuit. The main fast abnormality is an abnormality in which the frequency of the main reference clock signal $CLK_M$ becomes much higher than the first reference frequency (here, 2.2 MHz), which is a design value. The sub slow abnormality is an abnormality in which the frequency of the sub reference clock signal $CLK_S$ becomes much lower than the second reference frequency (here, 2.2 MHz), which is a design value. The self-diagnosis circuit 18 cannot determine which of these abnormalities has occurred. However, since the self-diagnosis circuit 18 cannot correctly monitor the operation of the microcomputer 2 under a situation where there is a possibility of the main fast abnormality, when it is determined that there is an abnormality in the diagnosis target circuit based on the relationship between the count values Ca[1] and Ca[3], the self-diagnosis circuit 18 outputs an abnormal signal as the diagnosis result signal Sig1.

In addition, the self-diagnosis circuit 18 can determine whether or not there is an abnormality in the diagnosis target circuit based on the relationship between the count value Ca[2] and the count value Ca[4], in each unit count interval. Specifically, the self-diagnosis circuit 18 has a function of comparing the count value Ca[4] with a predetermined second reference value $VAL_{A2}$ and a function of comparing the count value Ca[2] with a predetermined second determination value $VAL_{B2}$. In each unit count interval, when the count value Ca[2] does not reach the second determination value $VAL_{B2}$ until the count value Ca[4] reaches the second reference value $VAL_{A2}$, the self-diagnosis circuit 18 determines that there is an abnormality in the diagnosis target circuit.

When the diagnosis target circuit is normal, in the example of the frequency design value shown in FIG. 13, the count value Ca[4] may be about twice the count value Ca[2] in each unit count interval. Therefore, for example, ($VAL_{A2}$, $VAL_{B2}$)=(1,000, 490). The second reference value $VAL_{A2}$ may be the same as or different from the above-mentioned first reference value $VAL_{A1}$ (the same applies to Example EX3_2 to be described later). Similarly, the second determination value $VAL_{B2}$ may be the same as or different from the above-mentioned first determination value $VAL_{B1}$ (the same applies to Example EX3_2 to be described later).

In each unit count interval, when the count value Ca[2] does not reach the second determination value $VAL_{B2}$ until the count value Ca[4] reaches the second reference value $VAL_{A2}$, it is presumed that either a main slow abnormality or a sub fast abnormality has occurred in the diagnosis target circuit. The main slow abnormality is an abnormality in which the frequency of the main reference clock signal $CLK_M$ becomes much lower than the first reference frequency (here, 2.2 MHz), which is a design value. The sub fast abnormality is an abnormality in which the frequency of the sub reference clock signal $CLK_S$ becomes much higher than the second reference frequency (here, 2.2 MHz), which is a design value. The self-diagnosis circuit 18 cannot determine which of these abnormalities has occurred. However, since the self-diagnosis circuit 18 cannot correctly monitor the operation of the microcomputer 2 under a situation where there is a possibility of the main slow abnormality, when it is determined that there is an abnormality in the diagnosis target circuit based on the relationship between the count values Ca[2] and Ca[4], the self-diagnosis circuit 18 outputs an abnormal signal as the diagnosis result signal Sig1.

When it is not determined that there is an abnormality in the diagnosis target circuit based on the relationship between the count values Ca[1] and Ca[3] and it is not determined that there is an abnormality in the diagnosis target circuit based on the relationship between the count values Ca[2] and Ca[4], the self-diagnosis circuit 18 outputs a normal signal as the diagnosis result signal Sig1. That is, in a certain unit count interval, when the count value Ca[3] reaches the first determination value $VAL_{B1}$ before the count value Ca[1] reaches the first reference value $VAL_{A1}$ and when the count value Ca[2] reaches the second determination value $VAL_{B2}$ before the count value Ca[4] reaches the second reference value $VAL_{A2}$, the self-diagnosis circuit 18 outputs a normal signal as the diagnosis result signal Sig1 for the unit count interval.

Example EX3_2

Example EX3_2 will be described. In Example EX3_2, the self-diagnosis process is executed after the second frequency condition is satisfied. The second frequency condition is that the frequency of the frequency-divided clock signal D[3] is set to be higher than the frequency of the frequency-divided clock signal D[1] and the frequency of the frequency-divided clock signal D[4] is set to be lower than the frequency of the frequency-divided clock signal D[2].

Figure 14:
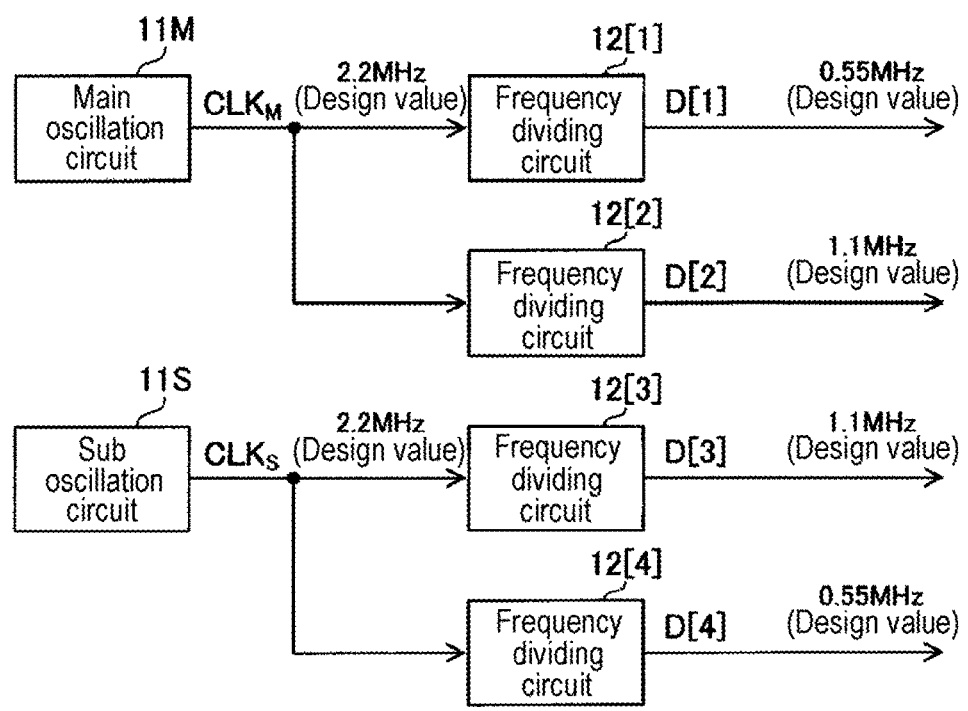
FIG. 14 is a view showing another specific example of the frequency of each clock signal according to the third embodiment of the present disclosure.

The self-diagnosis process according to Example EX3_2 will be described with specific numerical examples with reference to FIG. 14. FIG. 14 shows a specific example of the frequency of each clock signal when the oscillation circuits 11M and 11S and the frequency dividing circuits 12[1] to 12[4] are operating as designed with no abnormality in these circuits. As in Example EX3_1, it is here assumed that the first reference frequency, which is the design value of the frequency of the main reference clock signal $CLK_M$, and the second reference frequency, which is the design value of the frequency of the sub reference clock signal $CLK_S$, are both 2.2 MHz (megahertz). However, these design values may be different from each other.

In Example EX3_2, the frequency division ratios of the frequency dividing circuits 12[1] to 12[4] are set so as to satisfy the above-mentioned second frequency condition. Here, it is assumed that the frequency division ratios of the frequency dividing circuits 12[1] to 12[4] are 4, 2, 2, and 4, respectively. Then, the design values of the frequencies of the frequency-divided clock signals D[1] to D[4] are 0.55 MHz, 1.1 MHz, 1.1 MHz, and 0.55 MHz, respectively.

As described in Example EX3_1, whether or not the third embodiment is implemented in combination with the second embodiment is arbitrary. When the combination of the second embodiment and the third embodiment is not considered, the frequency division ratios of the frequency dividing circuits 12[1] to 12[4] may be fixed. However, when both the method shown in the second embodiment and the method shown in the third embodiment are to be realized by the WDT 10, the frequency division ratio of the frequency dividing circuit 12 [1] is variably set based on the frequency ratio setting data DTa as shown in the second embodiment. Therefore, in order to satisfy the second frequency condition after realizing the variable setting of the frequency division ratio of the frequency dividing circuit 12[1], the frequency dividing circuits 12[2] to 12[4] may be configured so that the frequency division ratios of the frequency dividing circuits 12[2] to 12[4] are also variable. For example, unlike the configuration of FIG. 14, in a case where the frequency division ratio of the frequency dividing circuit 12[1] is set to "8" based on the frequency division ratio setting data DTa, the frequency division ratios of the frequency dividing circuits 12[2] to 12[4] may be set to "4", "4," and "8", respectively. At this time, the control and setting of the frequency division ratios of the frequency dividing circuits 12[1] to 12[4] are realized by the setting circuit 15.

The self-diagnosis circuit 18 can determine whether or not there is an abnormality in the diagnosis target circuit based on the relationship between the count value Ca[1] and the count value Ca[3] in each unit count interval. Specifically, the self-diagnosis circuit 18 has a function of comparing the count value Ca[3] with a predetermined first reference value $VAL_{A1}$ and a function of comparing the count value Ca[1] with a predetermined first determination value $VAL_{B1}$. In each unit count interval, when the count value Ca[1] does not reach the first determination value $VAL_{B1}$ until the count value Ca[3] reaches the first reference value $VAL_{A1}$, the self-diagnosis circuit 18 determines that there is an abnormality in the diagnosis target circuit.

When the diagnosis target circuit is normal, in the example of the frequency design value shown in FIG. 14, the count value Ca[3] may be about twice the count value Ca[1] in each unit count interval. Therefore, for example, $(VAL_{A1}, VAL_{B1})=(1{,}000, 490)$.

In each unit count interval, when the count value Ca[1] does not reach the first determination value $VAL_{B1}$ until the count value Ca[3] reaches the first reference value $VAL_{A1}$, it is presumed that either a main slow abnormality or a sub fast abnormality has occurred in the diagnosis target circuit. The meanings of the main slow abnormality and the sub fast abnormality are as described above. The self-diagnosis circuit 18 cannot determine which of these abnormalities has occurred. However, since the self-diagnosis circuit 18 cannot correctly monitor the operation of the microcomputer 2 under a situation where there is a possibility of the main slow abnormality, when it is determined that there is an abnormality in the diagnosis target circuit based on the relationship between the count values Ca[1] and Ca[3], the self-diagnosis circuit 18 outputs an abnormal signal as the diagnosis result signal Sig1.

In addition, the self-diagnosis circuit 18 can determine whether or not there is an abnormality in the diagnosis target circuit based on the relationship between the count value Ca[2] and the count value Ca[4], in each unit count interval. Specifically, the self-diagnosis circuit 18 has a function of comparing the count value Ca[2] with a predetermined second reference value $VAL_{A2}$ and a function of comparing the count value Ca[4] with a predetermined second determination value $VAL_{B2}$. In each unit count interval, when the count value Ca[4] does not reach the second determination value $VAL_{B2}$ until the count value Ca[2] reaches the second reference value $VAL_{A2}$, the self-diagnosis circuit 18 determines that there is an abnormality in the diagnosis target circuit.

When the diagnosis target circuit is normal, in the example of the frequency design value shown in FIG. 14, the count value Ca[2] may be about twice the count value Ca[4] in each unit count interval. Therefore, for example, $(VAL_{A2}, VAL_{B2})=(1{,}000, 490)$.

In each unit count interval, when the count value Ca[4] does not reach the second determination value $VAL_{B2}$ until the count value Ca[2] reaches the second reference value $VAL_{A2}$, it is presumed that either a main fast abnormality or a sub low abnormality has occurred in the diagnosis target circuit. The meanings of the main fast abnormality and the sub slow abnormality are as described above. The self-diagnosis circuit 18 cannot determine which of these abnormalities has occurred. However, since the self-diagnosis circuit 18 cannot correctly monitor the operation of the microcomputer 2 under a situation where there is a possibility of the main fast abnormality, when it is determined that there is an abnormality in the diagnosis target circuit based on the relationship between the count values Ca[2] and Ca[4], the self-diagnosis circuit 18 outputs an abnormal signal as the diagnosis result signal Sig1.

When it is not determined that there is an abnormality in the diagnosis target circuit based on the relationship between the count values Ca[1] and Ca[3] and it is not determined that there is an abnormality in the diagnosis target circuit based on the relationship between the count values Ca[2] and Ca[4], the self-diagnosis circuit 18 outputs a normal signal as the diagnosis result signal Sig1. That is, in a certain unit count interval, when the count value Ca[1] reaches the first determination value $VAL_{B1}$ before the count value Ca[3] reaches the first reference value $VAL_{A1}$ and when the count value Ca[4] reaches the second determination value $VAL_{B2}$ before the count value Ca[2] reaches the second reference value $VAL_{A2}$, the self-diagnosis circuit 18 outputs a normal signal as the diagnosis result signal Sig1 for the unit count interval.

Fourth Embodiment

A fourth embodiment of the present disclosure will be described. The fourth embodiment involves a start-up diagnosis process performed in conjunction with the third embodiment. In the start-up diagnosis process, before starting the monitoring process by the monitoring circuit 14 when the monitoring device 1 is started, by intentionally making the frequency of the sub reference clock signal $CLK_S$ abnormal, it is checked whether or not the function of the self-diagnosis process shown in the third embodiment works normally, which will be described in detail below.

Figure 15:
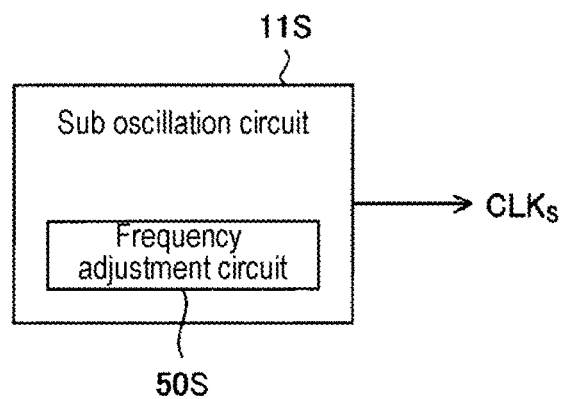
FIG. 15 is a view showing a state in which a frequency adjustment circuit is included in a sub oscillation circuit, according to a fourth embodiment of the present disclosure.
Figure 16:
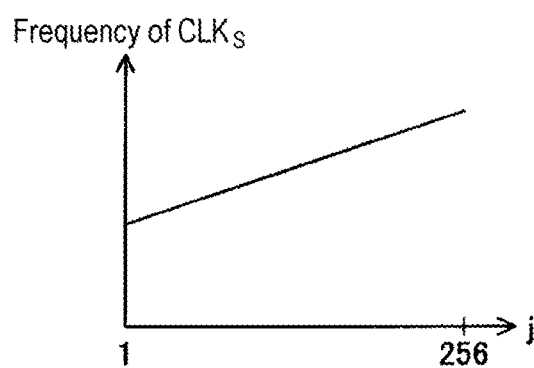
FIG. 16 is a view showing a state in which the frequency of a clock signal output from a sub oscillation circuit changes depending on the state of the frequency adjustment circuit according to the fourth embodiment of the present disclosure.

In the start-up diagnosis process, a frequency adjustment circuit 50S provided in the sub oscillation circuit 11S is used (see FIG. 15). The frequency adjustment circuit 50S is a circuit that can adjust the frequency of the sub reference clock signal $CLK_S$ output from the sub oscillation circuit 11S in a plurality of steps. In a shipping adjustment process of the monitoring device 1, the frequency adjustment circuit 50S is provided in order to adjust the frequency of the sub reference clock signal $CLK_S$ to the second reference frequency (for example, 2.2 MHz), which is a design value thereof. The state of the frequency adjustment circuit 50S is any one of the first to m-th adjustment states, where m is an integer of 3 or more. In this embodiment, "m=256." As shown in FIG. 16, for an arbitrary natural number j, it is assumed that the frequency of the clock signal $CLK_S$ is higher when the frequency adjustment circuit 50S is in the (j+1)-th adjustment state than when the frequency adjustment circuit 50S is in the j-th adjustment state.

Since the configuration for adjustment of the frequency of the output clock signal of the oscillation circuit is well known, detailed illustration thereof is omitted. For example, in a case where the sub oscillation circuit 11S is formed so as to generate the clock signal $CLK_S$ by a configuration in which a CR circuit composed of a capacitor and a resistor is arranged in a feedback loop of an amplifier, since the frequency of the clock signal $CLK_S$ is changed by changing the capacitance value of the capacitor or the resistance value of the resistor, a circuit that can change the capacitance value of the capacitor or the resistance value of the resistor in m steps may be provided in the frequency adjustment circuit 50S. Alternatively, for example, in a case where the oscillation circuit 11S is provided with a constant current circuit and has a configuration in which the frequency of the clock signal $CLK_S$ is changed by changing a constant current flowing through the constant current circuit, a circuit that can change the value of the constant current in m steps may be provided in the frequency adjustment circuit 50S.

Although it is not specifically shown, a frequency adjustment circuit 50M similar to the frequency adjustment circuit 50S is provided in the main oscillation circuit 11M. In the shipping adjustment process of the monitoring device 1, the frequency adjustment circuit 50M is used to adjust the frequency of the main reference clock signal $CLK_M$ to the first reference frequency (for example, 2.2 MHz), which is a design value thereof (however, as described above, the frequency of the clock signal $CLK_M$ may deviate from the design value).

Now, in order to adjust the frequency of the clock signal $CLK_S$ to the second reference frequency (for example, 2.2 MHz), which is the design value thereof, in the shipping adjustment process of the monitoring device 1, it is assumed to have been determined that it is optimal to set the state of the frequency adjustment circuit 50S to the $m_O$-th state. In this case, in the shipping adjustment process, shipping adjustment data indicating the value of "$m_O$" is written in the shipping adjustment data storage part 20 (see FIG. 6), which is a nonvolatile memory provided in the processing block 13. After writing this data, each time the monitoring device 1 is started, the shipping adjustment data in the storage part 20 is read, and the state of the frequency adjustment circuit 50S can be set to the $m_O$-th state. The same may apply to the frequency adjustment circuit 50M in the main oscillation circuit 11M.

Although there is a method of fixing the state of the frequency adjustment circuit 50S to the $m_O$-th state using a laser cutting method or the like, it is assumed that the frequency adjustment circuit 50S is configured so that the state of the frequency adjustment circuit 50S can be set to any one of the first to m-th adjustment states even after the shipping adjustment process.

In addition, it is assumed that "$m_O$" is always an integer greater than 1 and less than m. That is, it is assumed that the frequency adjustment circuit 50S is designed so that "$m_O=1$" is not established and "$m_O=m$" is not established. Therefore, the frequency of the clock signal $CLK_S$ can be made higher or lower than that in the $m_O$-th state.

Figure 17:
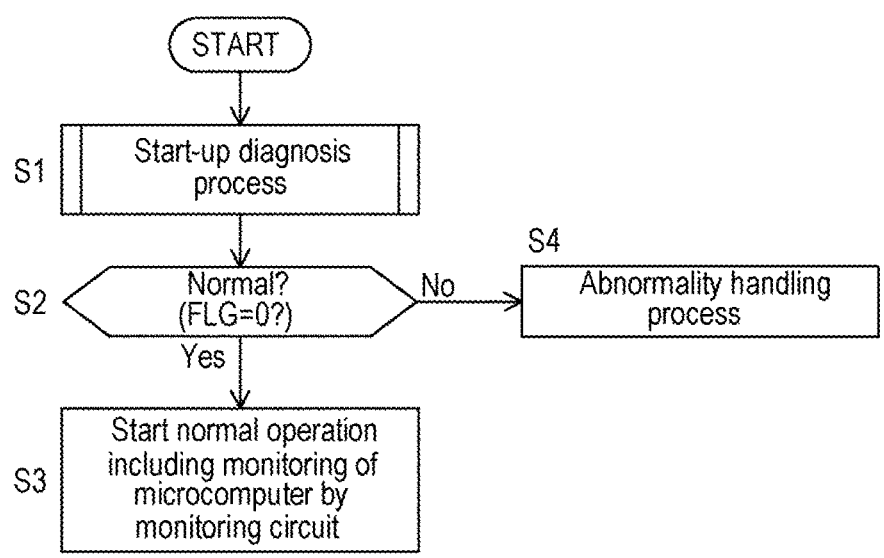
FIG. 17 is an overall flowchart of a monitoring device according to the fourth embodiment of the present disclosure.

FIG. 17 is an overall flowchart of the monitoring device 1. When supply of power to the monitoring device 1 is begun and the monitoring device 1 and the WDT 10 are started, first, in step S1, a start-up diagnosis process is executed by the start-up diagnosis circuit 19 (see FIG. 6). In the subsequent step S2, the result of the start-up diagnosis process is checked. As will be described in detail later, when "0" or "1" is substituted into a flag FLG in the start-up diagnosis process and the value of the flag FLG is "0" in step S2, the start-up diagnosis process is determined to be completed normally and proceeds to step S3. On the other hand, when the value of the flag FLG is "1" in step S2, the start-up diagnosis process is determined to be completed abnormally and proceeds to step S4. The flag FLG is a one-bit flag managed by the control circuit 17 or the start-up diagnosis circuit 19.

In step S3, the control circuit 17 starts a predetermined normal operation. The normal operation may be considered to include all the operations of the monitoring device 1 described in the first to third embodiments. Accordingly, the normal operation includes monitoring of the occurrence of a slow error and a fast error by the monitoring circuit 14 and the output of the signal $WD_{OUT}$ based on the monitoring result. It may be understood that starting the predetermined normal operation refers to controlling the monitoring circuit 14 so as to start an operation for monitoring whether or not a slow error or a fast error have occurred. In the normal operation, the frequency of the sub reference clock signal $CLK_S$ is set to a predetermined second reference frequency (however, it may deviate from the second reference frequency due to a failure or the like).

On the other hand, in step S4, the above-described normal operation is not started, and the control circuit 17 executes a predetermined abnormality handling process. The abnormality handling process in step S4 includes, for example, a process of transmitting a predetermined abnormality handling signal to the host device 3 and a process of storing data, which indicates that the above-described diagnosis target circuit is abnormal, in the memory 16.

Figure 18:
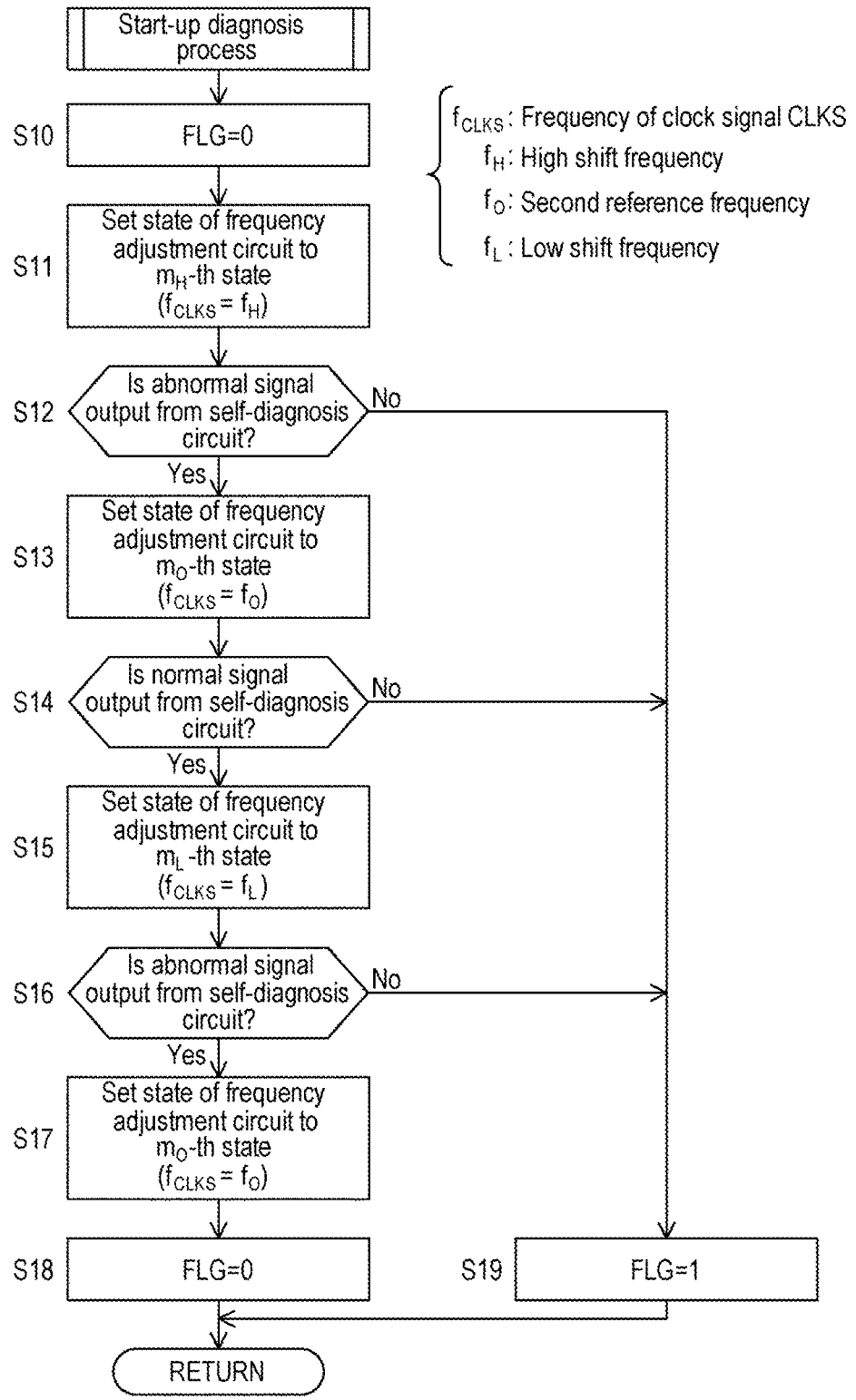
FIG. 18 is a flowchart of a start-up diagnosis process according to the fourth embodiment of the present disclosure.
Figure 19:
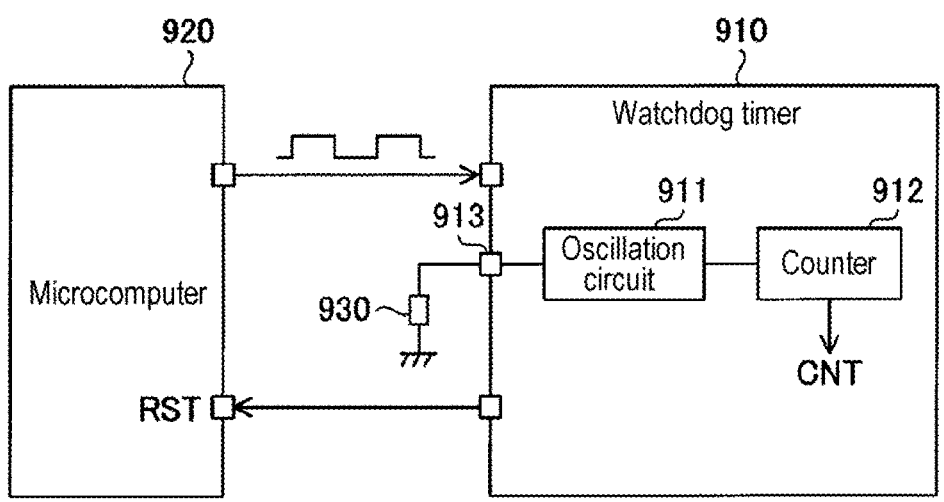
FIG. 19 is a view showing a schematic configuration of a conventional arithmetic processing system.

FIG. 18 is a flowchart of the start-up diagnosis process. Here, the frequency of the sub reference clock signal $CLK_S$ is represented by a symbol "$f_{CLKS}$," and the second reference frequency which is the design value (target value) of the frequency $f_{CLKS}$ in the normal operation is represented by a symbol "$f_O$." When the sub oscillation circuit 11S is normal, the frequency of the clock signal $CLK_S$ becomes the second reference frequency $f_O$ by setting the state of the frequency adjustment circuit 50S to the $m_O$-th state (disregarding a deviation due to temperature or the like). In the start-up diagnosis process, the frequency $f_{CLKS}$ of the sub reference clock signal $CLK_S$ is intentionally shifted from the second reference frequency $f_O$, but it is assumed that the frequency of the main reference clock signal $CLK_M$ is fixed at the target first reference frequency through the start-up diagnosis process and the normal operation (however, it may deviate from the first reference frequency due to a failure or the like).

In the start-up diagnosis process, first, in step S10, "1" is substituted into the flag FLG as an initial value, and then the process proceeds to step S11.

In step S11, the start-up diagnosis circuit 19 sets the frequency $f_{CLKS}$ of the clock signal $CLK_S$ to a shift frequency $f_H$ higher than the predetermined second reference frequency $f_O$ by setting the state of the frequency adjustment circuit 50S to the $m_H$-th state. Here, "$m_H > m_O$" is established. For example, "$m_H = 256$" may be determined, or the value of "$m_H$" may be determined based on the shipping adjustment data (that is, based on the value of $m_O$). In any event, when the high shift frequency $f_H$ is set to the frequency $f_{CLKS}$ in a situation where there is no abnormality in the diagnosis target circuit, it is assumed that the high shift frequency $f_H$ is sufficiently high so that an abnormal signal is expected to be output from the self-diagnosis circuit 18. In step S12 following step S11, the start-up diagnosis circuit 19 checks whether or not an abnormal signal is output from the self-diagnosis circuit 18 in a state where the frequency $f_{CLKS}$ is set to the high shift frequency $f_H$. When an abnormal signal is output, the process proceeds from step S12 to step S13. When a normal signal is output, the process proceeds from step S12 to step S19.

In step S13, the start-up diagnosis circuit 19 sets the frequency $f_{CLKS}$ of the clock signal $CLK_S$ to the predetermined second reference frequency $f_O$ by setting the state of the frequency adjustment circuit 50S to the $m_O$-th state. In step S14 following step S13, the start-up diagnosis circuit 19 checks whether or not a normal signal is output from the self-diagnosis circuit 18 in a state where the frequency $f_{CLKS}$ is set to the second reference frequency $f_O$. When a normal signal is output, the process proceeds from step S14 to step S15. When an abnormal signal is output, the process proceeds from step S14 to step S19.

In step S15, the start-up diagnosis circuit 19 sets the frequency $f_{CLKS}$ of the clock signal $CLK_S$ to a shift frequency $f_L$ lower than the predetermined second reference frequency $f_O$ by setting the state of the frequency adjustment circuit 50S to the $m_L$-th state. Here, "$m_L < m_O$" is established. For example, "$m_L = 1$" may be determined, or the value of "$m_L$" may be determined based on the shipping adjustment data (that is, based on the value of $m_O$). In any event, when the low shift frequency $f_L$ is set to the frequency $f_{CLKS}$ in a situation where there is no abnormality in the diagnosis target circuit, it is assumed that the low shift frequency $f_L$ is sufficiently low so that an abnormal signal is expected to be output from the self-diagnosis circuit 18. In step S16 following step S15, the start-up diagnosis circuit 19 checks whether or not an abnormal signal is output from the self-diagnosis circuit 18 in a state where the frequency $f_{CLKS}$ is set to the low shift frequency $f_L$. When an abnormal signal is output, the process proceeds from step S16 to step S17. When a normal signal is output, the process proceeds from step S16 to step S19.

In step S17, the start-up diagnosis circuit 19 sets the frequency $f_{CLKS}$ of the clock signal $CLK_S$ to the predetermined second reference frequency $f_O$ by setting the state of the frequency adjustment circuit 50S to the $m_O$-th state, and then the process proceeds to step S18.

The case of proceeding to step S18 corresponds to a situation where it is determined that the start-up diagnosis process has been normally completed, and the case of proceeding to step S19 corresponds to a situation where it is determined that the start-up diagnosis process has been abnormally completed. The start-up diagnosis circuit 19 substitutes "0" into the flag FLG in step S18, while substituting "1" into the flag FLG in step S19. After the process of step S18 or S19, the process proceeds to step S2 in FIG. 17.

The case where the start-up diagnosis process is abnormally completed corresponds to a case where the self-diagnosis process described in the third embodiment does not function normally due to some failure or the like, and it may not be appropriate to perform the monitoring process by the monitoring circuit 14 in the situation where the self-diagnosis process does not function normally. When the operation of the embodiment of the present disclosure is used, the monitoring process by the monitoring circuit 14 can be performed in a state in which the self-diagnosis process is functioning normally, so that the reliability of the WDT 10 is increased.

The control circuit 17 does not perform an operation of special response to the diagnosis result signal Sig1 (see FIG. 11) during the execution of the start-up diagnosis process. As long as a normal signal is output as the diagnosis result signal Sig1 during the execution of the normal operation, the control circuit 17 continues the normal operation. When an abnormal signal is output as the diagnosis result signal Sig1 during the execution of the normal operation, the control circuit 17 executes a predetermined abnormality handling process. The abnormality handling process mentioned here may be the same as or similar to the abnormality handling process of step S4. Further, when an abnormal signal is output as the diagnosis result signal Sig1 during the execution of the normal operation, the monitoring circuit 14 may stop the operation for monitoring whether or not a slow error or a fast error has occurred, and may fix the signal WD$_{OUT}$ to a low level (that is, no error signal may be output regardless of the clear signal input state).

The start-up diagnosis process of FIG. 18 includes a first process including steps S11 and S12, a second process including steps S13 and S14, and a third process including steps S15 and S16. In the flowchart of FIG. 18, these processes are executed in the order of the first process, the second process and the third process, but the execution order of the first to third processes may be arbitrarily changed. If the second process is executed last among the first to third processes, since the frequency f$_{CLKS}$ is set to the second reference frequency f$_O$ at the end of the second process, the process of step S17 may be omitted.

Fifth Embodiment

A fifth embodiment of the present disclosure will be described. The fifth embodiment involves modification techniques and supplemental matters for the first to fourth embodiments.

In order to ensure the effectiveness of the above-described self-diagnosis process, the main oscillation circuit 11M and the sub oscillation circuit 11S may be two oscillation circuits provided independently of each other. When the oscillation circuits 11M and 11S are two independent oscillation circuits, even if an abnormality occurs in one of the oscillation circuits 11M and 11S and the frequency of a reference clock signal from one oscillation circuit greatly deviates from a predetermined design frequency, the abnormality does not affect the other oscillation circuit. However, power supply voltages for driving the oscillation circuits 11M and 11S may be common to the oscillation circuits 11M and 11S or may be different from each other.

The clock signals CLK$_M$ and CLK$_S$ from the oscillation circuits 11M and 11S are asynchronous with each other, but may be synchronized with each other.

The arithmetic processing system of FIG. 1 including the monitoring device 1 may be incorporated in an arbitrary apparatus. For example, the arithmetic processing system may be mounted on a vehicle such as an automobile, or may be mounted on a portable information terminal or a home appliance.

As described above (see FIG. 4), the monitoring device 1 corresponds to a semiconductor device (electronic component) formed by enclosing a semiconductor integrated circuit in a housing (package) made of resin, or is included in a component of the semiconductor device. Such semiconductor device or monitoring device 1 itself may constitute a composite IC (Integrated Circuit) having other monitoring functions in addition to the function of monitoring the operation of the microcomputer 2 by the WDT 10. Other monitoring functions are optional.

For example, when the arithmetic processing system of FIG. 1 is mounted on a vehicle such as an automobile, the semiconductor device or the monitoring device 1 itself may be provided with a voltage monitoring function. The voltage monitoring function is, for example, a function of individually measuring a plurality of DC voltages generated by a power supply circuit installed in a vehicle and monitoring whether or not the value of each of the DC voltages is within a predetermined range.

The embodiments of the present disclosure can be variously modified as appropriate within the scope of the technical idea recited in the claims. The above embodiments are merely examples of the embodiments of the present disclosure, and the meanings of the terms of the present disclosure or constituent elements thereof are not limited to those described in the above embodiments. The specific numerical values recited in the above description are merely examples, and as a matter of course, they may be changed to other various numerical values.

According to the present disclosure in some embodiments, it is possible to provide a window type watchdog timer and a semiconductor device that contribute to a reduction in the number of parts or an improvement in design flexibility of a monitoring target device. In addition, according to the present disclosure in some embodiments, it is possible to provide a window type watchdog timer and a semiconductor device having a function of diagnosing the presence or absence of an abnormality of its own.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A window type watchdog timer for monitoring a target device, comprising:
    an oscillation circuit configured to generate a predetermined reference clock signal;
    a frequency dividing circuit configured to generate a frequency-divided clock signal by dividing a frequency of the reference clock signal;
    a monitoring circuit configured to:
        monitor occurrence of a first error in which clear control from the target device is interrupted for a first time or more, and occurrence of a second error in which an interval between two consecutive clear controls from the target device is shorter than a second time, which is shorter than the first time, based on the frequency-divided clock signal; and
        output a predetermined error signal when the first error or the second error is detected; and
    a setting circuit configured to variably set the first time and the second time by variably setting a frequency division ratio in the frequency dividing circuit and variably setting a detection condition of the first error and the second error.

2. The window type watchdog timer of claim 1, wherein the setting circuit is configured to variably set a ratio between the first time and the second time.

3. The window type watchdog timer of claim 1, wherein the monitoring circuit includes a counter configured to obtain a count value by counting a number of clocks of the frequency-divided clock signal,
    wherein the monitoring circuit is configured to monitor the occurrence of the first error based on the count value and a first threshold corresponding to the first time, and monitor the occurrence of the second error based on the count value and a second threshold corresponding to the second time, and
    wherein the setting circuit is configured to variably set the first time and the second time by variably setting the frequency division ratio and variably setting at least one selected from the group consisting of the first threshold and the second threshold.

4. The window type watchdog timer of claim 3, wherein one of the first threshold and the second threshold has a predetermined fixed value,
wherein the setting circuit is configured to:
set a ratio between the first time and the second time by setting one of the first threshold and the second threshold, with the other having a fixed value as a reference, based on first data indicative of a ratio between the first threshold and the second threshold; and
set the first time and the second time by setting the frequency division ratio based on second data different from the first data, and
wherein the window type watchdog timer further comprises a memory in which the first data and the second data are stored in a rewritable manner.

5. The window type watchdog timer of claim 1, wherein the oscillation circuit includes:
a first oscillation circuit configured to generate a first reference clock signal; and
a second oscillation circuit configured to generate a second reference clock signal,
wherein the frequency dividing circuit includes:
a first frequency dividing circuit configured to generate a first frequency-divided clock signal as the frequency-divided clock signal by dividing a frequency of the first reference clock signal;
a second frequency dividing circuit configured to generate a second frequency-divided clock signal by dividing the frequency of the first reference clock signal;
a third frequency dividing circuit configured to generate a third frequency-divided clock signal by dividing a frequency of the second reference clock signal; and
a fourth frequency dividing circuit configured to generate a fourth frequency-divided clock signal by dividing the frequency of the second reference clock signal,
wherein the monitoring circuit is configured to monitor the occurrence of the first error and the second error based on the first frequency-divided clock signal,
wherein the setting circuit is configured to variably set the first time and the second time by variably setting the frequency division ratio in the first frequency dividing circuit and variably setting the detection condition of the first error and the second error,
wherein the window type watchdog timer further comprises a self-diagnosis circuit configured to determine whether or not an abnormality occurs in a diagnosis target circuit including the first oscillation circuit, based on the first to fourth frequency-divided clock signals, and
wherein a frequency of the third frequency-divided clock signal is set to be lower than a frequency of the first frequency-divided clock signal and a frequency of the fourth frequency-divided clock signal is set to be higher than a frequency of the second frequency-divided clock signal, or the frequency of the third frequency-divided clock signal is set to be higher than the frequency of the first frequency-divided clock signal and the frequency of the fourth frequency-divided clock signal is set to be lower than the frequency of the second frequency-divided clock signal.

6. A semiconductor device comprising the window type watchdog timer of claim 1 that is configured by a semiconductor integrated circuit.

7. A window type watchdog timer for monitoring a target device, comprising:
a first oscillation circuit configured to generate a first reference clock signal;
a first frequency dividing circuit configured to generate a first frequency-divided clock signal by dividing a frequency of the first reference clock signal;
a second frequency dividing circuit configured to generate a second frequency-divided clock signal by dividing the frequency of the first reference clock signal;
a second oscillation circuit configured to generate a second reference clock signal;
a third frequency dividing circuit configured to generate a third frequency-divided clock signal by dividing a frequency of the second reference clock signal;
a fourth frequency dividing circuit configured to generate a fourth frequency-divided clock signal by dividing the frequency of the second reference clock signal;
a monitoring circuit configured to:
monitor occurrence of a first error in which clear control from the target device is interrupted for a first time or more, and occurrence of a second error in which an interval between two consecutive clear controls from the target device is shorter than a second time, which is shorter than the first time, based on the first frequency-divided clock signal; and
output a predetermined error signal when the first error or the second error is detected; and
a self-diagnosis circuit configured to determine whether or not an abnormality occurs in a diagnosis target circuit including the first oscillation circuit, based on the first to fourth frequency-divided clock signals,
wherein a frequency of the third frequency-divided clock signal is set to be lower than a frequency of the first frequency-divided clock signal and a frequency of the fourth frequency-divided clock signal is set to be higher than a frequency of the second frequency-divided clock signal, or the frequency of the third frequency-divided clock signal is set to be higher than the frequency of the first frequency-divided clock signal and the frequency of the fourth frequency-divided clock signal is set to be lower than the frequency of the second frequency-divided clock signal.

8. The window type watchdog timer of claim 7, wherein the self-diagnosis circuit includes a counter part configured to:
obtain first, second, third, and fourth count values by counting a number of clocks of the first, second, third, and fourth frequency-divided clock signals, respectively; and
determine whether or not the abnormality occurs in the diagnosis target circuit, based on a relationship between the first count value and the third count value and a relationship between the second count value and the fourth count value.

9. The window type watchdog timer of claim 8, wherein the frequency of the third frequency-divided clock signal is set to be lower than the frequency of the first frequency-divided clock signal and the frequency of the fourth frequency-divided clock signal is set to be higher than the frequency of the second frequency-divided clock signal, and
wherein the self-diagnosis circuit determines that the abnormality occurs in the diagnosis target circuit when the third count value does not reach a first determination value until the first count value reaches a first reference value, or when the second count value does not reach a second determination value until the fourth count value reaches a second reference value.

10. The window type watchdog timer of claim 8, wherein the frequency of the third frequency-divided clock signal is set to be higher than the frequency of the first frequency-divided clock signal and the frequency of the fourth frequency-divided clock signal is set to be lower than the frequency of the second frequency-divided clock signal, and
wherein the self-diagnosis circuit determines that the abnormality occurs in the diagnosis target circuit when the first count value does not reach a first determination value until the third count value reaches a first reference value, or when the fourth count value does not reach a second determination value until the second count value reaches a second reference value.

11. The window type watchdog timer of claim 7, further comprising:
a control circuit; and
a start-up diagnosis circuit configured to execute a start-up diagnosis process including first to third processes,
wherein the self-diagnosis circuit outputs a predetermined abnormal signal when it is determined that the abnormality occurs in the diagnosis target circuit, and outputs a predetermined normal signal when it is not determined that the abnormality occurs in the diagnosis target circuit,
wherein the second oscillation circuit is configured to set the frequency of the second reference clock signal to any one of a predetermined reference frequency, a high shift frequency higher than the reference frequency, and a low shift frequency lower than the reference frequency,
wherein the start-up diagnosis circuit is configured to:
in the first process, set the frequency of the second reference clock signal to the high shift frequency and check whether or not the abnormal signal is output from the self-diagnosis circuit;
in the second process, set the frequency of the second reference clock signal to the reference frequency and check whether or not the normal signal is output from the self-diagnosis circuit; and
in the third process, set the frequency of the second reference clock signal to the low shift frequency and check whether or not the abnormal signal is output from the self-diagnosis circuit,
wherein, the control circuit sets the frequency of the second reference clock signal to the reference frequency and then starts a normal operation in which the occurrence of the first error and the second error is monitored by the monitoring circuit in a case in which the abnormal signal is output in the first process, the normal signal is output in the second process, and the abnormal signal is output in the third process, and,
wherein, the control circuit executes a predetermined abnormality handling process in any other case.

* * * * *